(12) United States Patent
Sridharan et al.

(10) Patent No.: US 12,250,070 B2
(45) Date of Patent: Mar. 11, 2025

(54) RATE MATCHING FOR MULTI-SLOT UPLINK SHARED CHANNEL TRANSMISSION

(71) Applicant: QUALCOMM Incorporated, San Diego, CA (US)

(72) Inventors: Gokul Sridharan, Sunnyvale, CA (US); Hung Dinh Ly, San Diego, CA (US); Wanshi Chen, San Diego, CA (US); Peter Gaal, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 350 days.

(21) Appl. No.: 17/747,724

(22) Filed: May 18, 2022

(65) Prior Publication Data

US 2022/0385395 A1 Dec. 1, 2022

Related U.S. Application Data

(60) Provisional application No. 63/201,971, filed on May 20, 2021, provisional application No. 63/190,781, filed on May 19, 2021.

(51) Int. Cl.
*H04L 1/00* (2006.01)
*H03M 13/11* (2006.01)

(52) U.S. Cl.
CPC ....... *H04L 1/0013* (2013.01); *H03M 13/1111* (2013.01); *H04L 1/0061* (2013.01); *H04L 1/0071* (2013.01)

(58) Field of Classification Search
CPC .............. H03M 13/1111; H04L 1/0013; H04L 1/0061; H04L 1/0067; H04L 1/0071;
(Continued)

(56) References Cited

U.S. PATENT DOCUMENTS

2022/0303987 A1* 9/2022 Sridharan ......... H04W 72/0446
2022/0322337 A1* 10/2022 Sridharan ............. H04L 1/1861
2022/0330232 A1* 10/2022 Sridharan ............. H04L 1/0041

OTHER PUBLICATIONS

Huawei, et al., "Discussion on TB Processing Over Multi-Slot PUSCH", 3GPP TSG RAN WG1 #105-e, R1-2104242, 3rd Generation Partnership Project, Mobile Competence Centre, 650, Route Des Lucioles, F-06921 Sophia-Antipolis Cedex, France, vol. RAN WG1, No. e-Meeting, May 10-May 27, 2021, May 12, 2021, 10 Pages, XP052010696, Title, p. 1, Sections 2.1 and 2.2, 2.2.2-2.2.6.
(Continued)

*Primary Examiner* — Robert J Lopata
(74) *Attorney, Agent, or Firm* — Harrity & Harrity, LLP

(57) ABSTRACT

Various aspects of the present disclosure generally relate to wireless communication. In some aspects, a user equipment (UE) may receive an indication of one or more sets of contiguous time domain resources for a multi-slot transmission occasion that spans at least multiple slots. The UE may select, for one or more codeblocks of a communication on the multi-slot transmission occasion, coded bits of a plurality of coded bits on a per slot basis for each of the multiple slots, wherein start locations for bit selection for each of the multiple slots are determined independently from one another. The UE may interleave the coded bits to form one or more interleaved encoded bit sequences of the one or more codeblocks. The UE may transmit the communication including the one or more interleaved encoded bit sequences. Numerous other aspects are described.

30 Claims, 20 Drawing Sheets

(58) Field of Classification Search
CPC ... H04L 1/1819; H04L 5/0044; H04L 5/0046; H04L 5/0091
USPC .......................................................... 370/329
See application file for complete search history.

(56) References Cited

OTHER PUBLICATIONS

International Search Report and Written Opinion—PCT/US2022/072429—ISA/EPO—Sep. 2, 2022.
Qualcomm Incorporated: "TB Processing Over Multi-slot PUSCH", 3GPP TSG-RAN WG1 Meeting #106bis-e, R1-2110202, 3rd Generation Partnership Project, Mobile Competence Centre, 650, Route Des Lucioles, F-06921 Sophia-Antipolis Cedex, France, vol. RAN WG1, No. e-Meeting, Oct. 11-Oct. 19, 2021, Oct. 2, 2021, XP052059138, 11 Pages, Sections 2.2-2.4, Appendix A.
Samsung: "Tb Processing Over Multi-Slot PUSCH", 3GPP TSG RAN WG1 #104b-e, R1-2103252, 3rd Generation Partnership Project, Mobile Competence Centre, 650, Route Des Lucioles, F-06921 Sophia-Antipolis Cedex, France, vol. RAN WG1, No. e-Meeting, Apr. 12-Apr. 20, 2021, Apr. 7, 2021, XP052178028, 8 Pages, Section 2.1 and 2.6.

* cited by examiner

| $rv_{id}$ indicated by the TBoMS DCI | $rv_{id}$ to be applied to $n^{th}$ RV bundle | | | |
|---|---|---|---|---|
| | $n \bmod 4 = 0$ | $n \bmod 4 = 1$ | $n \bmod 4 = 2$ | $n \bmod 4 = 3$ |
| 0 | 0 | 2 | 3 | 1 |
| 2 | 2 | 3 | 1 | 0 |
| 3 | 3 | 1 | 0 | 2 |
| 1 | 1 | 0 | 2 | 3 |

FIGURE 15

RATE MATCHING FOR MULTI-SLOT UPLINK SHARED CHANNEL TRANSMISSION

CROSS-REFERENCE TO RELATED APPLICATION

This patent application claims priority to U.S. Provisional Patent Application No. 63/201,971, filed on May 20, 2021, entitled "RATE MATCHING FOR MULTI-SLOT UPLINK SHARED CHANNEL TRANSMISSION," and to U.S. Provisional Patent Application No. 63/190,781, filed on May 19, 2021, entitled "REDUNDANCY VERSION BUNDLING FOR A MULTI-SLOT TRANSPORT BLOCK," both assigned to the assignee hereof. The disclosures of the prior applications are considered part of and are incorporated by reference into this patent application.

FIELD OF THE DISCLOSURE

Aspects of the present disclosure generally relate to wireless communication and specifically, to techniques and apparatuses for rate matching for multi-slot uplink shared channel transmission.

BACKGROUND

Wireless communication systems are widely deployed to provide various telecommunication services such as telephony, video, data, messaging, and broadcasts. Typical wireless communication systems may employ multiple-access technologies capable of supporting communication with multiple users by sharing available system resources (for example, bandwidth or transmit power). Examples of such multiple-access technologies include code division multiple access (CDMA) systems, time division multiple access (TDMA) systems, frequency-division multiple access (FDMA) systems, orthogonal frequency-division multiple access (OFDMA) systems, single-carrier frequency-division multiple access (SC-FDMA) systems, time division synchronous code division multiple access (TD-SCDMA) systems, and Long Term Evolution (LTE). LTE/LTE-Advanced is a set of enhancements to the Universal Mobile Telecommunications System (UMTS) mobile standard promulgated by the Third Generation Partnership Project (3GPP).

The above multiple access technologies have been adopted in various telecommunication standards to provide a common protocol that enables different user equipments (UEs) to communicate on a municipal, national, regional, and even global level. New Radio (NR), which may also be referred to as 5G, is a set of enhancements to the LTE mobile standard promulgated by the 3GPP. NR is designed to better support mobile broadband Internet access by improving spectral efficiency, lowering costs, improving services, making use of new spectrum, and better integrating with other open standards using orthogonal frequency division multiplexing (OFDM) with a cyclic prefix (CP) (CP-OFDM) on the downlink (DL), using CP-OFDM or SC-FDMA (for example, also known as discrete Fourier transform spread OFDM (DFT-s-OFDM)) on the uplink (UL), as well as supporting beamforming, multiple-input multiple-output (MIMO) antenna technology, and carrier aggregation. However, as the demand for mobile broadband access continues to increase, there exists a need for further improvements in LTE and NR technologies. Preferably, these improvements are applicable to other multiple access technologies and the telecommunication standards that employ these technologies.

In some situations, it may be beneficial for a UE to use an interleaver process to vary the bits of a wireless transmission in an effort to improve the performance and quality of the transmission. Some wireless transmissions may span multiple slots, such as a single physical uplink shared channel (PUSCH) transmitted on two or more contiguous slots, or a single PUSCH transmitted in two or more segments, each of which occupies two or more contiguous slots. While the interleaving process is designed to improve transmission performance, when a PUSCH or other transmission spans multiple slots, the interleaving process becomes more complex and less efficient.

SUMMARY

In some aspects, a method of wireless communication performed by a user equipment (UE) includes receiving an indication of one or more sets of time domain resources for a multi-slot transmission occasion that spans at least multiple slots; selecting, for one or more codeblocks of a communication on the multi-slot transmission occasion, coded bits of a plurality of coded bits on a per slot basis for each of the multiple slots, wherein start locations for bit selection for each of the multiple slots are independent of an actual number of bits selected for transmission in another slot; interleaving the coded bits to form one or more interleaved encoded bit sequences of the one or more codeblocks; and transmitting the communication including the one or more interleaved encoded bit sequences.

In some aspects, a method of wireless communication performed by a base station includes transmitting an indication of one or more sets of time domain resources for a multi-slot transmission occasion that spans at least multiple slots; receiving, on the multi-slot transmission occasion, a communication including an interleaved encoded bit sequence of one or more codeblocks; demapping the communication to obtain soft information for each of a plurality of transmitted bits; de-interleaving, to obtain de-interleaved soft information, the soft information on a per slot basis for each of the multiple slots; concatenating the de-interleaved soft information to obtain concatenated soft information, wherein start locations for concatenation for each of the multiple slots are independent of an actual number of bits selected for transmission in another slot; and decoding the concatenated soft information to infer one or more codeblocks of the communication.

In some aspects, an apparatus for wireless communication at a UE includes a memory, and one or more processors, coupled to the memory, configured to: receive an indication of one or more sets of time domain resources for a multi-slot transmission occasion that spans at least multiple slots; select, for one or more codeblocks of a communication on the multi-slot transmission occasion, coded bits of a plurality of coded bits on a per slot basis for each of the multiple slots, wherein start locations for bit selection for each of the multiple slots are independent of an actual number of bits selected for transmission in another slot; interleave the coded bits to form one or more interleaved encoded bit sequences of the one or more codeblocks; and transmit the communication including the one or more interleaved encoded bit sequences.

In some aspects, an apparatus for wireless communication at a base station includes a memory, and one or more processors, coupled to the memory, configured to: transmit an indication of one or more sets of time domain resources for a multi-slot transmission occasion that spans at least multiple slots; receive, on the multi-slot transmission occasion, a communication including an interleaved encoded bit sequence of one or more codeblocks; demap the communication to obtain soft information for each of a plurality of transmitted bits; de-interleave, to obtain de-interleaved soft information, the soft information on a per slot basis for each of the multiple slots; concatenate the de-interleaved soft information to obtain concatenated soft information, wherein start locations for concatenation for each of the multiple slots are independent of an actual number of bits selected for transmission in another slot; and decode the concatenated soft information to infer one or more codeblocks of the communication.

In some aspects, a non-transitory computer-readable medium storing a set of instructions for wireless communication includes one or more instructions that, when executed by one or more processors of a UE, cause the UE to: receive an indication of one or more sets of time domain resources for a multi-slot transmission occasion that spans at least multiple slots; select, for one or more codeblocks of a communication on the multi-slot transmission occasion, coded bits of a plurality of coded bits on a per slot basis for each of the multiple slots, wherein start locations for bit selection for each of the multiple slots are independent of an actual number of bits selected for transmission in another slot; interleave the coded bits to form one or more interleaved encoded bit sequences of the one or more codeblocks; and transmit the communication including the one or more interleaved encoded bit sequences.

In some aspects, a non-transitory computer-readable medium storing a set of instructions for wireless communication includes one or more instructions that, when executed by one or more processors of a base station, cause the base station to: transmit an indication of one or more sets of time domain resources for a multi-slot transmission occasion that spans at least multiple slots; receive, on the multi-slot transmission occasion, a communication including an interleaved encoded bit sequence of one or more codeblocks; demap the communication to obtain soft information for each of a plurality of transmitted bits; de-interleave, to obtain de-interleaved soft information, the soft information on a per slot basis for each of the multiple slots; concatenate the de-interleaved soft information to obtain concatenated soft information, wherein start locations for concatenation for each of the multiple slots are independent of an actual number of bits selected for transmission in another slot; and decode the concatenated soft information to infer one or more codeblocks of the communication.

In some aspects, an apparatus for wireless communication includes means for receiving an indication of one or more sets of time domain resources for a multi-slot transmission occasion that spans at least multiple slots; means for selecting, for one or more codeblocks of a communication on the multi-slot transmission occasion, coded bits of a plurality of coded bits on a per slot basis for each of the multiple slots, wherein start locations for bit selection for each of the multiple slots are independent of an actual number of bits selected for transmission in another slot; means for interleaving the coded bits to form one or more interleaved encoded bit sequences of the one or more codeblocks; and means for transmitting the communication including the one or more interleaved encoded bit sequences.

In some aspects, an apparatus for wireless communication includes means for transmitting an indication of one or more sets of time domain resources for a multi-slot transmission occasion that spans at least multiple slots; means for receiving, on the multi-slot transmission occasion, a communication including an interleaved encoded bit sequence of one or more codeblocks; means for demapping the communication to obtain soft information for each of a plurality of transmitted bits; means for de-interleaving, to obtain de-interleaved soft information, the soft information on a per slot basis for each of the multiple slots; means for concatenating the de-interleaved soft information to obtain concatenated soft information, wherein start locations for concatenation for each of the multiple slots are independent of an actual number of bits selected for transmission in another slot; and means for decoding the concatenated soft information to infer one or more codeblocks of the communication.

Aspects generally include a method, apparatus, system, computer program product, non-transitory computer-readable medium, user equipment, base station, wireless communication device, or processing system as substantially described with reference to and as illustrated by the drawings and specification.

The foregoing has outlined rather broadly the features and technical advantages of examples in accordance with the disclosure in order that the detailed description that follows may be better understood. Additional features and advantages will be described hereinafter. The conception and specific examples disclosed may be readily utilized as a basis for modifying or designing other structures for carrying out the same purposes of the present disclosure. Such equivalent constructions do not depart from the scope of the appended claims. Characteristics of the concepts disclosed herein, both their organization and method of operation, together with associated advantages will be better understood from the following description when considered in connection with the accompanying figures. Each of the figures is provided for the purposes of illustration and description, and not as a definition of the limits of the claims.

BRIEF DESCRIPTION OF THE DRAWINGS

So that the above-recited features of the present disclosure can be understood in detail, a more particular description, briefly summarized above, may be had by reference to aspects, some of which are illustrated in the appended drawings. It is to be noted, however, that the appended drawings illustrate only some typical aspects of this disclosure and are therefore not to be considered limiting of its scope, for the description may admit to other equally effective aspects. The same reference numbers in different drawings may identify the same or similar elements.

FIG. 15 is a diagram illustrating an example of an RV table, in accordance with the present disclosure.

DETAILED DESCRIPTION

Various aspects of the disclosure are described more fully hereinafter with reference to the accompanying drawings. This disclosure may, however, be embodied in many different forms and are not to be construed as limited to any specific structure or function presented throughout this disclosure. Rather, these aspects are provided so that this disclosure will be thorough and complete, and will fully convey the scope of the disclosure to those skilled in the art. Based on the teachings herein one skilled in the art may appreciate that the scope of the disclosure is intended to cover any aspect of the disclosure disclosed herein, whether implemented independently of or combined with any other aspect of the disclosure. For example, an apparatus may be implemented or a method may be practiced using any quantity of the aspects set forth herein. In addition, the scope of the disclosure is intended to cover such an apparatus or method which is practiced using other structure, functionality, or structure and functionality in addition to or other than the various aspects of the disclosure set forth herein. Any aspect of the disclosure disclosed herein may be embodied by one or more elements of a claim.

Several aspects of telecommunication systems will now be presented with reference to various apparatuses and techniques. These apparatuses and techniques will be described in the following detailed description and illustrated in the accompanying drawings by various blocks, modules, components, circuits, steps, processes, or algorithms (collectively referred to as "elements"). These elements may be implemented using hardware, software, or a combination of hardware and software. Whether such elements are implemented as hardware or software depends upon the particular application and design constraints imposed on the overall system.

Figure 1:
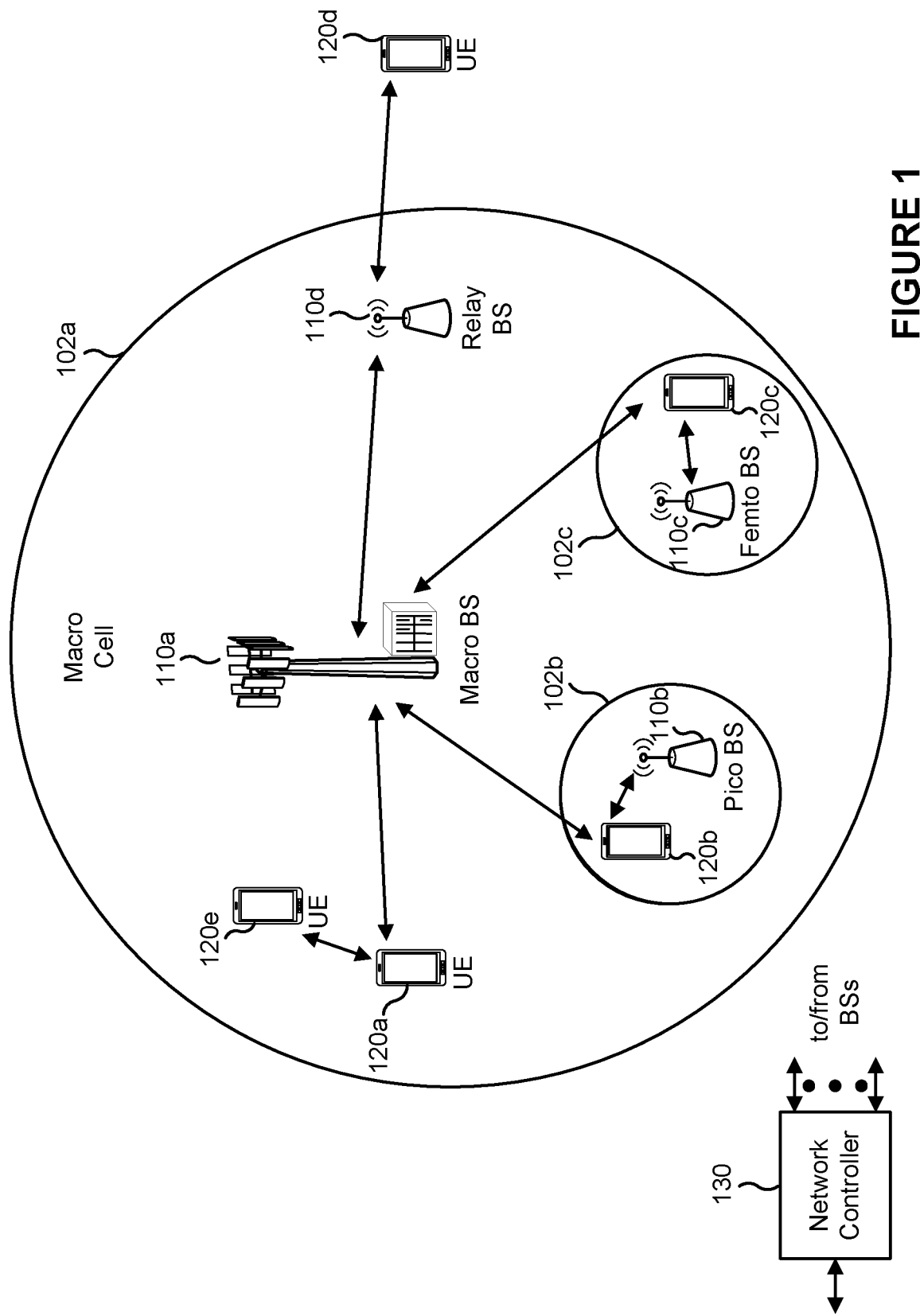
FIG. 1 is a diagram illustrating an example of a wireless network in accordance with the present disclosure.

FIG. 1 is a diagram illustrating an example of a wireless network in accordance with the present disclosure. The wireless network may be or may include elements of a 5G (NR) network or an LTE network, among other examples. The wireless network may include one or more base stations 110 (shown as BS 110*a*, BS 110*b*, BS 110*c*, and BS 110*d*) and other network entities. A base station (BS) is an entity that communicates with user equipment (UEs) and may also be referred to as an NR BS, a Node B, a gNB, a 5G node B (NB), an access point, or a transmit receive point (TRP), among other examples. Each BS may provide communication coverage for a particular geographic area. In 3GPP, the term "cell" can refer to a coverage area of a BS or a BS subsystem serving this coverage area, depending on the context in which the term is used.

A BS may provide communication coverage for a macro cell, a pico cell, a femto cell, or another type of cell. A macro cell may cover a relatively large geographic area (for example, several kilometers in radius) and may allow unrestricted access by UEs with service subscription. A pico cell may cover a relatively small geographic area and may allow unrestricted access by UEs with service subscription. A femto cell may cover a relatively small geographic area (for example, a home) and may allow restricted access by UEs having association with the femto cell (for example, UEs in a closed subscriber group (CSG)). A BS for a macro cell may be referred to as a macro BS. A BS for a pico cell may be referred to as a pico BS. A BS for a femto cell may be referred to as a femto BS or a home BS. A BS may support one or multiple (for example, three) cells.

The wireless network may be a heterogeneous network that includes BSs of different types, such as macro BSs, pico BSs, femto BSs, or relay BSs. These different types of BSs may have different transmit power levels, different coverage areas, and different impacts on interference in the wireless network. For example, macro BSs may have a high transmit power level (for example, 5 to 40 watts) whereas pico BSs, femto BSs, and relay BSs may have lower transmit power levels (for example, 0.1 to 2 watts). In the example shown in FIG. 1, a BS 110*a* may be a macro BS for a macro cell 102*a*, a BS 110*b* may be a pico BS for a pico cell 102*b*, and a BS 110*c* may be a femto BS for a femto cell 102*c*. A network controller 130 may couple to the set of BSs 110, and may provide coordination and control for these BSs. Network controller 130 may communicate with the BSs via a backhaul. The BSs may also communicate with one another, for example, directly or indirectly via a wireless or wireline backhaul.

In some aspects, a cell may not be stationary, rather, the geographic area of the cell may move in accordance with the location of a mobile BS. In some aspects, the BSs may be interconnected to one another or to one or more other BSs or network nodes (not shown) in the wireless network through various types of backhaul interfaces, such as a direct physical connection or a virtual network, using any suitable transport network.

The wireless network may also include relay stations. A relay station is an entity that can receive a transmission of data from an upstream station (for example, a BS or a UE) and send a transmission of the data to a downstream station (for example, a UE or a BS). A relay station may also be a UE that can relay transmissions for other UEs. In the example shown in FIG. 1, a relay BS 110d may communicate with macro BS 110a and a UE 120d in order to facilitate communication between BS 110a and UE 120d. A relay BS may also be referred to as a relay station, a relay base station, or a relay, among other examples.

UEs 120 (for example, 120a, 120b, 120c) may be dispersed throughout the wireless network, and each UE may be stationary or mobile. A UE may also be referred to as an access terminal, a terminal, a mobile station, a subscriber unit, or a station, among other examples. A UE may be a cellular phone (for example, a smart phone), a personal digital assistant (PDA), a wireless modem, a wireless communication device, a handheld device, a laptop computer, a cordless phone, a wireless local loop (WLL) station, a tablet, a camera, a gaming device, a netbook, a smartbook, an ultrabook, a medical device or equipment, biometric sensors/devices, wearable devices (smart watches, smart clothing, smart glasses, smart wrist bands, smart jewelry (for example, smart ring, smart bracelet)), an entertainment device (for example, a music or video device, or a satellite radio), a vehicular component or sensor, smart meters/sensors, industrial manufacturing equipment, a global positioning system device, or any other suitable device that is configured to communicate via a wireless medium.

Some UEs may be considered machine-type communication (MTC) or evolved or enhanced machine-type communication (eMTC) UEs. MTC and eMTC UEs include, for example, robots, drones, remote devices, sensors, meters, monitors or location tags, among other examples, that may communicate with a base station, another device (for example, remote device), or some other entity. A wireless node may provide, for example, connectivity for or to a network (for example, a wide area network such as Internet or a cellular network) via a wired or wireless communication link. Some UEs may be considered Internet-of-Things (IoT) devices, or may be implemented as NB-IoT (narrowband internet of things) devices. Some UEs may be considered a Customer Premises Equipment (CPE). UE 120 may be included inside a housing that houses components of UE 120, such as processor components or memory components, among other examples.

In general, any quantity of wireless networks may be deployed in a given geographic area. Each wireless network may support a particular radio access technology (RAT) and may operate on one or more frequencies or frequency channels. A frequency may also be referred to as a carrier among other examples. Each frequency may support a single RAT in a given geographic area in order to avoid interference between wireless networks of different RATs. In some cases, NR or 5G RAT networks may be deployed.

In some aspects, two or more UEs 120 (for example, shown as UE 120a and UE 120e) may communicate directly with one another using one or more sidelink channels (for example, without using a base station 110 as an intermediary). For example, the UEs 120 may communicate using peer-to-peer (P2P) communications, device-to-device (D2D) communications, a vehicle-to-everything (V2X) protocol (for example, which may include a vehicle-to-vehicle (V2V) protocol or a vehicle-to-infrastructure (V2I) protocol), a mesh network, or a combination thereof. In such examples, the UE 120 may perform scheduling operations, resource selection operations, or other operations described elsewhere herein as being performed by the base station 110.

Devices of the wireless network may communicate using the electromagnetic spectrum, which may be subdivided based on frequency or wavelength into various classes, bands, or channels. For example, devices of the wireless network may communicate using an operating band having a first frequency range (FR1), which may span from 410 MHz to 7.125 GHz. As another example, devices of the wireless network may communicate using an operating band having a second frequency range (FR2), which may span from 24.25 GHz to 52.6 GHz. The frequencies between FR1 and FR2 are sometimes referred to as mid-band frequencies. Although a portion of FR1 is greater than 6 GHz, FR1 is often referred to as a "sub-6 GHz" band. Similarly, FR2 is often referred to as a "millimeter wave" band despite being different from the extremely high frequency (EHF) band (30 GHz-300 GHz) which is identified by the International Telecommunications Union (ITU) as a "millimeter wave" band. Thus, unless specifically stated otherwise, it should be understood that the term "sub-6 GHz" may broadly represent frequencies less than 6 GHz, frequencies within FR1, mid-band frequencies (for example, greater than 7.125 GHz), or a combination thereof. Similarly, unless specifically stated otherwise, it should be understood that the term "millimeter wave" may broadly represent frequencies within the EHF band, frequencies within FR2, mid-band frequencies (for example, less than 24.25 GHz), or a combination thereof. The frequencies included in FR1 and FR2 may be modified, and techniques described herein are applicable to those modified frequency ranges.

Figure 2:
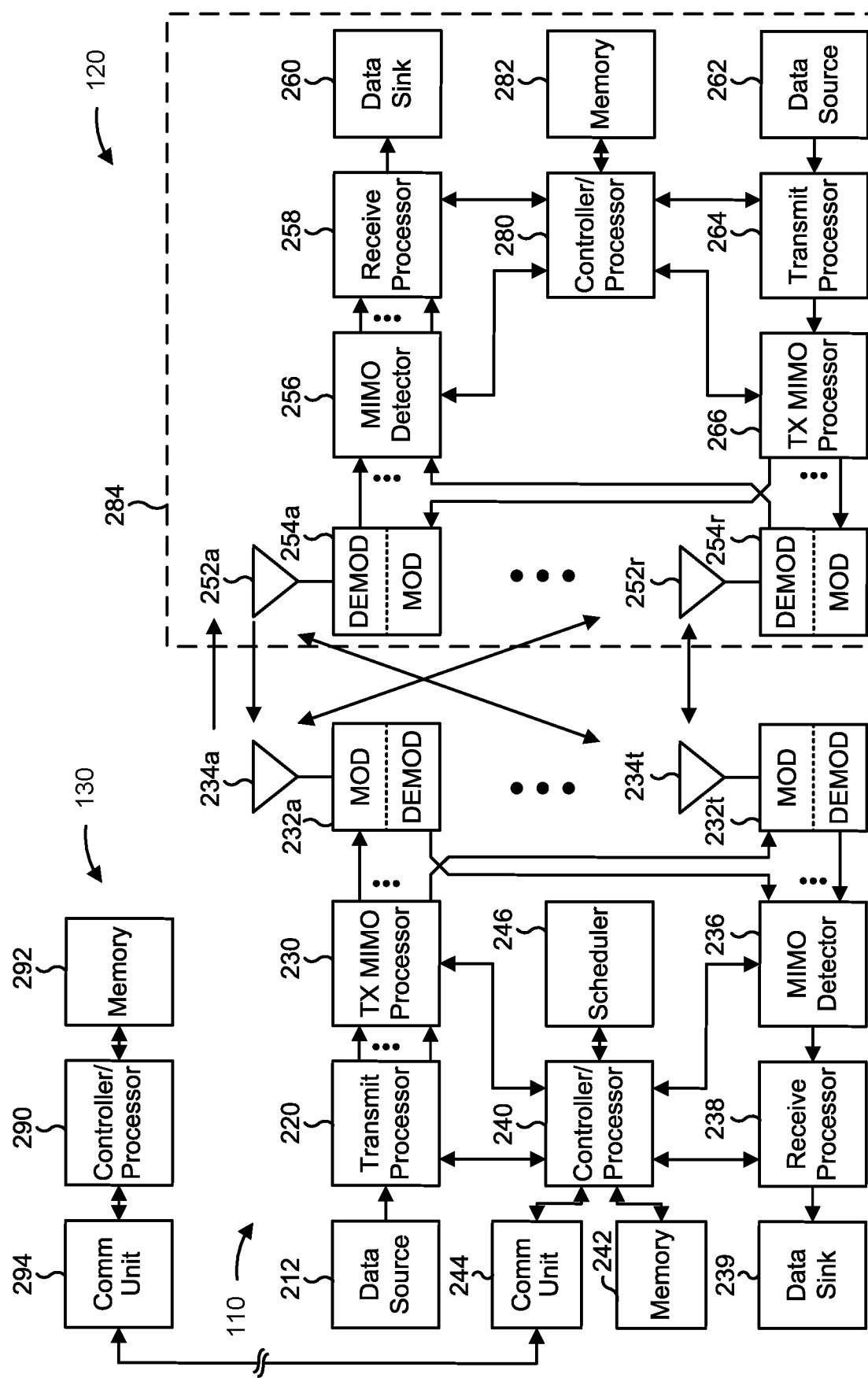
FIG. 2 is a diagram illustrating an example base station (BS) in communication with a user equipment (UE) in a wireless network in accordance with the present disclosure.

FIG. 2 is a diagram illustrating an example base station in communication with a UE in a wireless network in accordance with the present disclosure. The base station may correspond to base station 110 of FIG. 1. Similarly, the UE may correspond to UE 120 of FIG. 1.

Base station 110 may be equipped with T antennas 234a through 234t, and UE 120 may be equipped with R antennas 252a through 252r, where in general $T \geq 1$ and $R \geq 1$. At base station 110, a transmit processor 220 may receive data from a data source 212 for one or more UEs, select one or more modulation and coding schemes (MCSs) for each UE based at least in part on channel quality indicators (CQIs) received from the UE, process (for example, encode) the data for each UE based at least in part on the MCS(s) selected for the UE, and provide data symbols for all UEs. Transmit processor 220 may also process system information (for example, for semi-static resource partitioning information (SRPI) among other examples) and control information (for example, CQI requests, grants, or upper layer signaling) and provide overhead symbols and control symbols. Transmit processor 220 may also generate reference symbols for reference signals and synchronization signals. A transmit (TX) multiple-input multiple-output (MIMO) processor 230 may perform spatial processing (for example, precoding) on the data symbols, the control symbols, the overhead symbols, or the reference symbols, if applicable, and may provide T output symbol streams to T modulators (MODs) 232a through 232t. Each MOD 232 may process a respective output symbol stream (for example, for OFDM among other examples) to obtain an output sample stream. Each MOD 232 may further process (for example, convert to analog, amplify, filter, and upconvert) the output sample stream to obtain a downlink signal. T downlink signals from MODs 232a through 232t may be transmitted via T antennas 234a through 234t, respectively.

At UE 120, antennas 252a through 252r may receive the downlink signals from base station 110 or other base stations and may provide received signals to R demodulators (DE-MODs) 254a through 254r, respectively. Each DEMOD 254 may condition (for example, filter, amplify, downconvert, and digitize) a received signal to obtain input samples. Each DEMOD 254 may further process the input samples (for example, for OFDM) to obtain received symbols. A MIMO detector 256 may obtain received symbols from all R DEMODs 254a through 254r, perform MIMO detection on the received symbols if applicable, and provide detected symbols. A receive processor 258 may process (for example, decode) the detected symbols, provide decoded data for UE 120 to a data sink 260, and provide decoded control information and system information to a controller/processor 280. The term "controller/processor" may refer to one or more controllers, one or more processors, or a combination of one or more controllers and one or more processors. A channel processor may determine one or more of a reference signal received power (RSRP) parameter, a received signal strength indicator (RSSI) parameter, a reference signal received quality (RSRQ) parameter, or a CQI parameter, among other examples. In some aspects, one or more components of UE 120 may be included in a housing.

Network controller 130 may include communication unit 294, controller/processor 290, and memory 292. Network controller 130 may include, for example, one or more devices in a core network. Network controller 130 may communicate with base station 110 via communication unit 294.

Antennas (such as antennas 234a through 234t or antennas 252a through 252r) may include, or may be included within, one or more antenna panels, antenna groups, sets of antenna elements, or antenna arrays, among other examples. An antenna panel, an antenna group, a set of antenna elements, or an antenna array may include one or more antenna elements. An antenna panel, an antenna group, a set of antenna elements, or an antenna array may include a set of coplanar antenna elements or a set of non-coplanar antenna elements. An antenna panel, an antenna group, a set of antenna elements, or an antenna array may include antenna elements within a single housing or antenna elements within multiple housings. An antenna panel, an antenna group, a set of antenna elements, or an antenna array may include one or more antenna elements coupled to one or more transmission or reception components, such as one or more components of FIG. 2.

On the uplink, at UE 120, a transmit processor 264 may receive and process data from a data source 262 as well as control information (for example, for reports including RSRP, RSSI, RSRQ, or CQI) from controller/processor 280. Transmit processor 264 may also generate reference symbols for one or more reference signals. The symbols from transmit processor 264 may be precoded by a TX MIMO processor 266 if applicable, further processed by MODs 254a through 254r (for example, for discrete Fourier transform spread orthogonal frequency division multiplexing (DFT-s-OFDM) or orthogonal frequency division multiplexing (OFDM) with a cyclic prefix (CP) (CP-OFDM)), and transmitted to base station 110. In some aspects, a modulator and a demodulator (for example, MOD/DEMOD 254) of the UE 120 may be included in a modem of the UE 120. In some aspects, the UE 120 includes a transceiver. The transceiver may include any combination of antenna(s) 252, modulators 254, demodulators 254, MIMO detector 256, receive processor 258, transmit processor 264, or TX MIMO processor 266. The transceiver may be used by a processor (for example, controller/processor 280) and memory 282 to perform aspects of any of the methods described herein.

At base station 110, the uplink signals from UE 120 and other UEs may be received by antennas 234, processed by DEMODs 232, detected by a MIMO detector 236 if applicable, and further processed by a receive processor 238 to obtain decoded data and control information sent by UE 120. Receive processor 238 may provide the decoded data to a data sink 239 and the decoded control information to controller/processor 240. Base station 110 may include communication unit 244 and communicate to network controller 130 via communication unit 244. Base station 110 may include a scheduler 246 to schedule UEs 120 for downlink and uplink communications. In some aspects, a modulator and a demodulator (for example, MOD/DEMOD 232) of the base station 110 may be included in a modem of the base station 110. In some aspects, the base station 110 includes a transceiver. The transceiver may include any combination of antenna(s) 234, modulators 232, demodulators 232, MIMO detector 236, receive processor 238, transmit processor 220, or TX MIMO processor 230. The transceiver may be used by a processor (for example, controller/processor 240) and memory 242 to perform aspects of any of the methods described herein.

Controller/processor 240 of base station 110, controller/processor 280 of UE 120, or any other component(s) of FIG. 2 may perform one or more techniques associated with interleaver design for multi-slot uplink shared channel transmission, as described in more detail elsewhere herein. For example, controller/processor 240 of base station 110, controller/processor 280 of UE 120, or any other component(s) of FIG. 2 may perform or direct operations of, for example, process 1700 of FIG. 17, process 1800 of FIG. 18, or other processes as described herein. Memories 242 and 282 may store data and program codes for base station 110 and UE 120, respectively. In some aspects, memory 242 or memory 282 may include a non-transitory computer-readable medium storing one or more instructions (for example, code or program code) for wireless communication. For example, the one or more instructions, when executed (for example, directly, or after compiling, converting, or interpreting) by one or more processors of the base station 110 or the UE 120, may cause the one or more processors, the UE 120, or the base station 110 to perform or direct operations of, for example, process 1700 of FIG. 17, process 1800 of FIG. 18, or other processes as described herein. In some aspects, executing instructions may include running the instructions, converting the instructions, compiling the instructions, or interpreting the instructions, among other examples.

In some aspects, the UE includes means for receiving an indication of one or more sets of contiguous time domain resources for a multi-slot transmission occasion that spans at least multiple slots; means for selecting, for one or more codeblocks of a communication on the multi-slot transmission occasion, coded bits of a plurality of coded bits on one of: a per slot basis, for each of the multiple slots, or a per segment basis, for each of a plurality of segments, each segment including one of the one or more sets of contiguous time domain resources and spanning across at least two slots; means for interleaving the coded bits on one of the per slot basis or the per segment basis to form one or more interleaved encoded bit sequences of the one or more codeblocks; and/or means for transmitting the communication including the one or more interleaved encoded bit sequences. The means for the UE to perform operations described herein may include, for example, one or more of antenna 252, demodulator 254, MIMO detector 256, receive processor 258, transmit processor 264, TX MIMO processor 266, modulator 254, controller/processor 280, or memory 282.

In some aspects, the UE includes means for selecting a first subset of the plurality of coded bits for a first slot of the multi-slot transmission occasion; and/or means for selecting a second subset of the plurality of coded bits for a second slot of the multi-slot transmission occasion, wherein the first slot and the second slot are contiguous.

In some aspects, the UE includes means for selecting a first subset of a plurality of coded bits for a first segment of the multi-slot transmission occasion; and/or means for selecting a second subset of the plurality of coded bits for a second segment of the multi-slot transmission occasion, wherein the first segment and the second segment are associated with a single physical channel.

In some aspects, the base station includes means for transmitting an indication of one or more sets of contiguous time domain resources for a multi-slot transmission occasion that spans at least multiple slots; means for receiving, on the multi-slot transmission occasion, a communication including an interleaved encoded bit sequence of one or more codeblocks; means for demapping the codeblock to obtain soft information for each of a plurality of transmitted bits; means for de-interleaving the soft information on one of the per slot basis or the per segment basis to obtain de-interleaved soft information; means for concatenating the de-interleaved soft information to obtain concatenated soft information; and/or means for decoding the concatenated soft information to infer one or more codeblocks of the communication. The means for the base station to perform operations described herein may include, for example, one or more of transmit processor 220, TX MIMO processor 230, modulator 232, antenna 234, demodulator 232, MIMO detector 236, receive processor 238, controller/processor 240, memory 242, or scheduler 246.

In some aspects, the base station includes means for de-interleaving a first subset of the soft information for a first slot of the multi-slot transmission occasion; and/or means for de-interleaving a second subset of the soft information for a second slot of the multi-slot transmission occasion, wherein the first slot and the second slot are contiguous.

In some aspects, the base station includes means for de-interleaving a first subset of the soft information for a first segment of the multi-slot transmission occasion; and/or means for de-interleaving a second subset of the soft information for a second segment of the multi-slot transmission occasion, wherein the first segment and the second segment are associated with a single physical channel.

Figure 3:
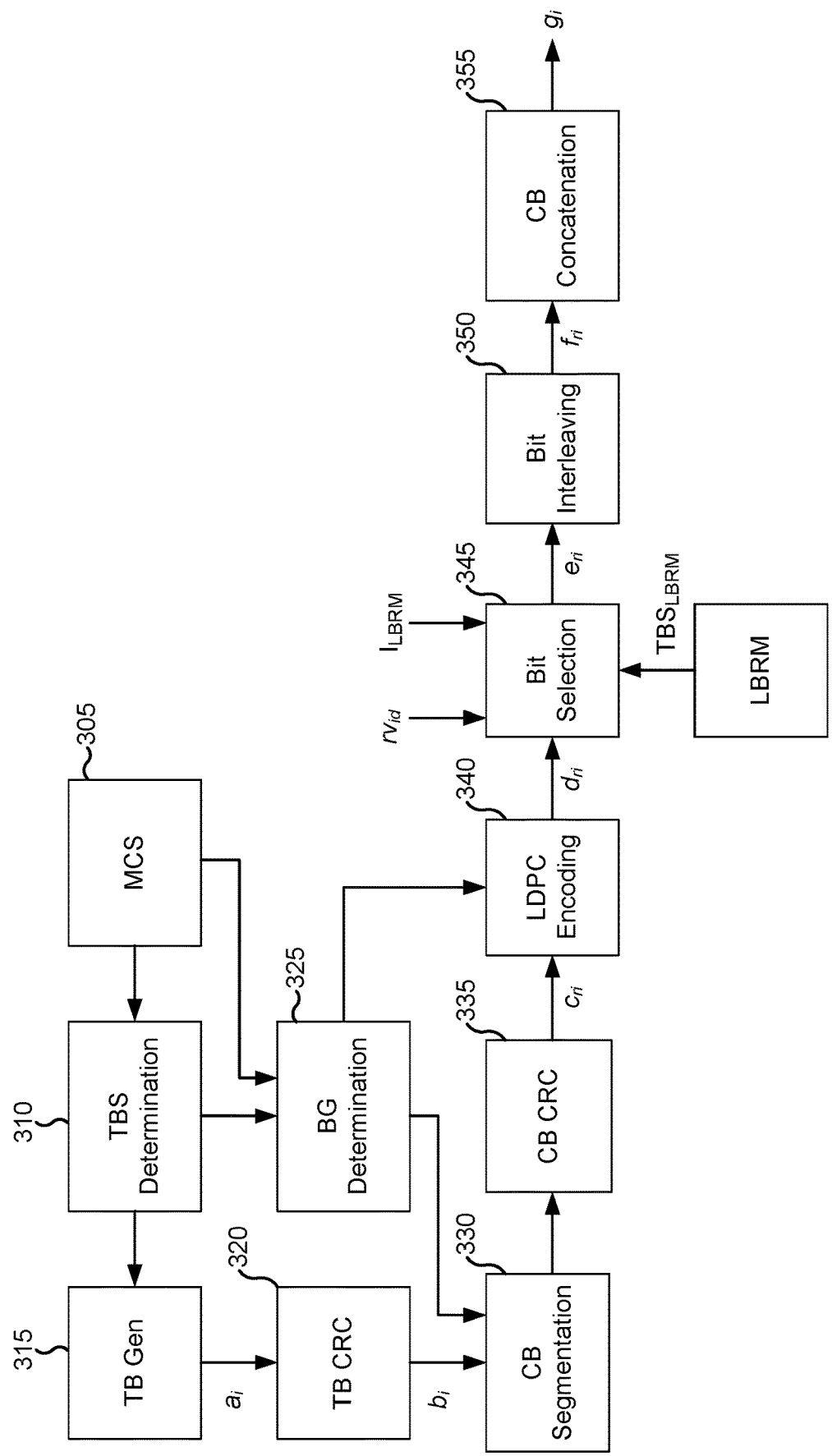
FIG. 3 is a diagram illustrating an example of an uplink transmission coding chain in accordance with the present disclosure.

FIG. 3 is a diagram illustrating an example of an uplink transmission coding chain in accordance with the present disclosure. The coding may be used for the transmission of data payloads in a wireless network, such as via a PUSCH or a physical downlink shared channel (PDSCH). The operations of FIG. 3 may be performed by a transmitter, such as a UE (e.g., UE 120) or a base station (e.g., base station 110).

The coding chain may be based at least in part on an MCS, which is shown at 305. An MCS is an index indicating a modulation order and a code rate for a communication. For example, an MCS may indicate how many bits can be transmitted per resource element. A modulation indicates a number of bits (whether parity bits or information bits) per resource element, and a code rate indicates a ratio between information bits and parity bits for encoding. Generally, the MCS is indicated via scheduling information for a given communication, such as in downlink control information (DCI).

At 310, the transmitter may determine a transport block size (TBS) based at least in part on the MCS. A TBS indicates how many bits are to be passed from the medium access control (MAC) layer to the physical layer in one instance of a uplink shared channel transmission that may span more than one slot. For example, the payload for the physical layer (such as in a PUSCH or a PDSCH) is a transport block. The transport block may include a number of bits, determined based at least in part on the MCS and a number of physical resource blocks (PRBs) to be used to transmit the transport block.

At 315, the transmitter may generate a transport block $a_i$. For example, the transport block may include a number of bits indicated by the TBS of the transport block. At 320, the UE may append a cyclic redundancy check (CRC) to the transport block to form a transport block $b_i$. The CRC aids in error detection. The CRC may be generated using a cyclic generator polynomial and may be appended to an end of the transport block.

At 325, the transmitter may determine a base graph (BG) for the transport block. A BG is a parameter for determining parity bits for a transmission based at least in part on a TBS and a code rate (with BG1 being intended for transport blocks with a larger TBS, and BG2 being intended for transport blocks with a smaller TBS).

At 330, the transmitter may perform codeblock (CB) segmentation for the transport block "CB segmentation" refers to segmentation of the transport block (TB) to form one or more codeblocks for channel coding and rate matching. Each codeblock may be encoded separately, as described below. For example, the steps shown by reference numbers 335 through 350 may be performed for each separate codeblock of the one or more codeblocks. At 335, the transmitter may append one or more CRCs to the one or more codeblocks to form codeblock(s) $c_{ri}$. For example, the transmitter may perform per-codeblock CRC determination and insertion on the one or more codeblocks $c_{ri}$, which aids in early error detection.

At 340, the transmitter may perform low-density parity check (LDPC) encoding on the one or more codeblocks $c_{ri}$ to form encoded bits $d_{ri}$. More generally, the transmitter may perform channel coding according to one or more parameters such as the BG determined at 320. The LDPC encoding may generate a plurality of encoded bits dr, that are stored in a circular buffer, as described in connection with FIG. 4. In some aspects, the encoded bits may be referred to as an encoded codeblock. The encoded bits $d_{ri}$ are distinct from the codeblocks $c_{ri}$.

At 345, the transmitter may perform bit selection. "Bit selection" refers to selecting coded bits (sometimes referred to as encoded bits) $e_{ri}$ (where the totality of the selected coded bits are represented by E) for interleaving and concatenation. For example, the coded bits $e_{ri}$ may be selected from the encoded bits $d_{ri}$. In some cases, "bit selection," limited buffer rate matching (LBRM), and/or bit interleaving are referred to as "rate matching." As shown, the bit selection may be based at least in part on a redundancy version index ($rv_{id}$), an LBRM index ($I_{LBRM}$), and an LBRM transport block size ($TBS_{LBRM}$).

The transmitter may select a number of coded bits per codeblock. The number of coded bits to be transmitted in a particular transmission (e.g., slot, PUSCH) for a codeblock index r is represented by $E_r$. There can be one or two different values for the number of coded bits per codeblock (e.g., the number of rate matched bits $E_r$ across a plurality of codeblocks could take a value X and/or a value Y per codeblock r, since it may not always be possible to divide available resources equally across all codeblocks). Codeblocks may be aligned to RE boundaries (for example, a single resource element carrying a particular modulation symbol may contain only bits corresponding to a single codeblock). G may represent the actual number of bits available for transmission (e.g., the total number of coded bits available for transmission of the transport block) for a single-slot transmission (that is, for a transmission occasion that occupies only one slot). C' may represent the number of codeblocks to be transmitted, wherein C' is according to a codeblock group transmission information (CBGTI) field if the CBGTI field is present in DCI, or is C (that is, all codeblocks) if the CBGTI field is not present. Bits may be selected (e.g., read) sequentially from the circular buffer. A starting position for a codeblock, $k_0$, may be determined by the redundancy version (RV). In the case of per segment rate matching or per slot rate matching, the starting position may be determined based at least in part on stored information, such as a last position from which the transmitter read a bit for a prior slot or segment. The number of bits read for a transport block is E, and the number of bits read for a given encoded bit sequence $e_{ri}$ is $E_r$, excluding filler bits.

Techniques described herein provide per slot rate matching and per segment rate matching. Further description is provided below. If per slot rate matching is used, G may be defined as the actual number of transmission bits available per slot, and $E_r$ may be defined as the number of coded bits of the rth codeblock to be transmitted in a given slot. If per segment rate matching is used, G may be defined as the actual number of transmission bits available per slot, and $E_r$ may be defined as the number of coded bits of the rth codeblock to be transmitted in a given segment.

At 350, the transmitter may perform interleaving to generate one or more interleaved encoded bit sequences $f_{ri}$. Recall that interleaving is performed on a per-codeblock basis (for each codeblock $c_{ri}$). In some cases, "interleaving" is referred to as "channel interleaving." In some aspects, the transmitter may perform row-column interleaving. In row-column interleaving, selected bits are arranged into a number of rows corresponding to the modulation order. Then, selected bits are read column-by-column, such that bits from each row are interleaved with each other. For redundancy version 0, the interleaver may be a systematic-bit priority interleaver, so that systematic bits are placed in higher reliability positions in a quadrature amplitude modulation (QAM) symbol. When binary phase shift keying (BPSK) is used, the interleaver may not affect the bit stream. At 355, the transmitter may perform codeblock concatenation on the encoded bit sequences $f_{ri}$ to generate a codeblock g (which is distinct from the codeblock(s) $c_{ri}$).

After the codeblock has been generated, the transmitter may transmit the codeblock. For example, the transmitter may perform scrambling, modulation, layer mapping, antenna port mapping, mapping to one or more virtual resource blocks, and mapping from virtual resource blocks to physical resource blocks. Then, the transmitter may transmit a communication carrying an encoded transport block, which is based at least in part on the codeblock.

A receiver may receive the communication carrying the encoded transport block over the time-frequency resources assigned for this transmission occasion. The receiver estimates the channel using the demodulation reference signals transmitted along with the encoded bits. Using the estimated channel and the received signal, the receiver performs the demapping operation on each resource element of the received signal to obtain soft information regarding the bit values of the encoded transport block. Soft information may take the form of a log-likelihood ratio (such as a probability, based on the received signal, that a transmitted bit is a 0 or a 1). This probability could be quantized to a few levels (for example, 16 or 32 levels). In the extreme case that the probability is quantized to 2 levels, the soft information degenerates to "hard" information. For example, a two-level quantization of the probability may represent the receiver's best estimation as to what the transmitted bit was, with no further nuance on this guess.

The receiver may perform de-interleaving on the soft information to obtain de-interleaved soft information. The receiver may concatenate the de-interleaved soft information to obtain concatenated soft information. For example, the receiver may concatenate the de-interleaved soft information based at least in part on starting locations for each of multiple slots, which may be analogous to the start locations in the circular buffer for bit selection, as described elsewhere herein. The receiver may decode the concatenated soft information to infer one or more codeblocks of the communication.

Figure 4:
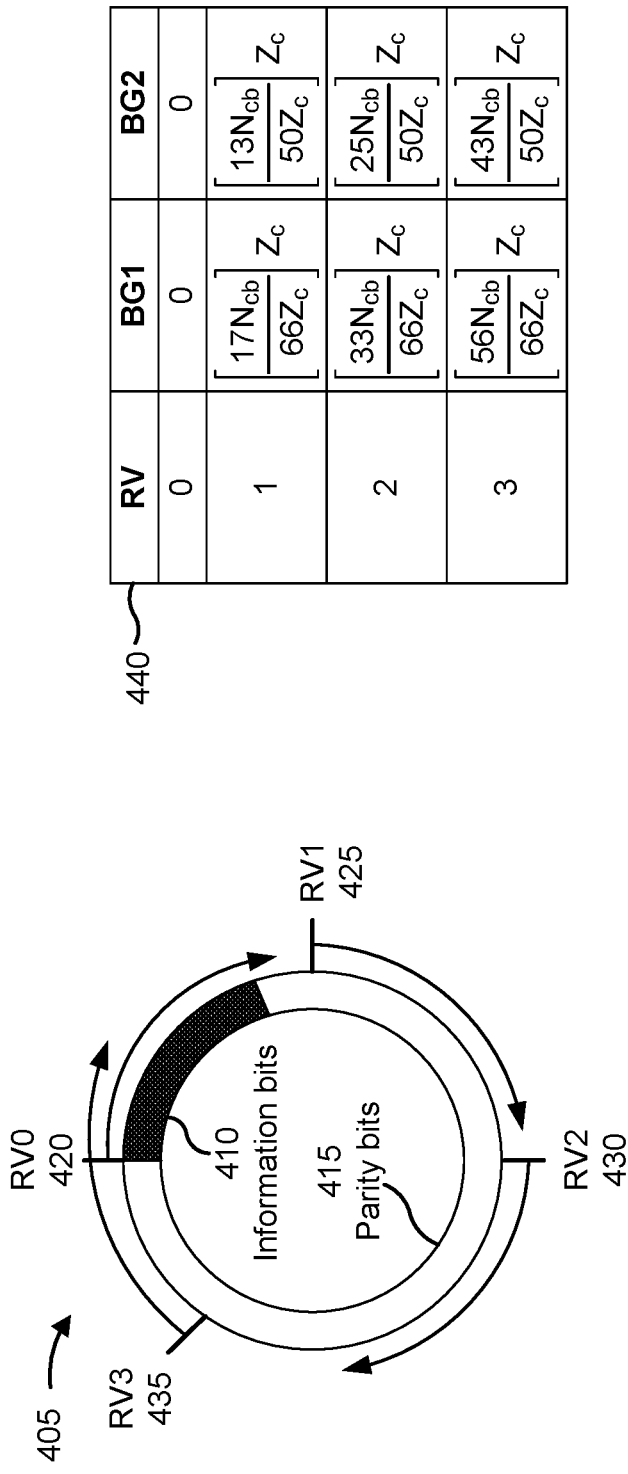
FIG. 4 is a diagram illustrating an example of redundancy version cycling based on uplink transmission occasions in accordance with the present disclosure.

FIG. 4 is a diagram illustrating an example of redundancy version cycling based on uplink transmission occasions, in accordance with the present disclosure. A UE (such as UE 120) may apply redundancy version cycling to PUSCH repetitions to transmit different redundancy versions of the PUSCH repetition in different transmission occasions (or in different slots or different segments of a transmission occasion).

"Redundancy version" (RV) of a PUSCH repetition may be used to select a set of encoded bits that are transmitted for that PUSCH repetition. The RV may indicate a starting location in a circular buffer such as circular buffer 405. Using RV cycling, the UE transmits a different set of encoded bits in different PUSCH repetitions. For example, the UE may store bits for an uplink transmission in a circular buffer 405 (stored in memory of the UE). The circular buffer 405 stores information bits 410 (sometimes called systematic bits) and parity bits 415 (sometimes called parity-check bits). The information bits 410 may include the data to be transmitted, and the parity bits 415 may include linear combinations of the data (that is, of the information bits 410). The UE may encode information bits 410, parity bits 415, or a combination of information bits 410 and parity bits 415 into a set of encoded bits and may transmit the set of encoded bits. The particular bits that are selected to be included in the set of encoded bits for a PUSCH repetition depend on (or are defined by) the RV of that PUSCH repetition. By selecting different combinations of information bits 410 and parity bits 415, the UE improves reliability of PUSCH transmission, since not all bit positions are associated with the same level of reliability.

As an example, the starting bit locations may be defined by a table 440, such as for NR hybrid automatic repeat request (HARD) using LDPC code. The table 440 defines starting bit locations in the circular buffer 405 for a first base graph (BG1) and a second base graph (BG2). A base graph is a parameter for determining parity bits 415 for a transmission based at least in part on a TB size and a code rate (with BG1 being intended for TBs with a larger TB size, and BG2 being intended for TBs with a smaller TB size). Referring to the table, $N_{cb}$ represents the length of the circular buffer 405 (e.g., the number of bits included in the circular buffer 405), and $Z_c$ represents a lifting size, which is based at least in part on the number of information bits 410 and the number of BG columns corresponding to information bits 410. The table 440 is just one example, and other starting bit locations may be used in practice.

In some examples, a base station (e.g., base station 110) may transmit information, such as an RV index, to the UE. For example, the base station may transmit the RV index for a PUSCH communication in DCI that schedules the PUSCH communication. The RV index may indicate a sequence of RVs to be applied to a corresponding sequence of occasions, such as a sequence of PUSCH transmission occasions, a sequence of slots, or a sequence of segments. The UE may increment a counter n (sometimes called an index n) for each occasion following (or indicated by) the DCI. The UE may use the information transmitted by the base station (the RV index) and the value of the counter n for a particular occasion to determine an RV to be applied to that occasion.

For example, as shown by table 445, for PUSCH Repetition Type A, if the base station indicates an RV index of 0, then the UE may determine an RV to be applied to an nth transmission occasion (for PUSCH Repetition Type A) by calculating n mod 4, where "mod" represents a modulo operation. If n mod 4=0 (for transmission occasion 0), then the UE applies RV0 to that transmission occasion. If n mod 4=1 (for transmission occasion 1), then the UE applies RV2 to that transmission occasion. If n mod 4=2 (for transmission occasion 2), then the UE applies RV3 to that transmission occasion. If n mod 4=3 (for transmission occasion 3), then the UE applies RV1 to that transmission occasion. As shown, the RV index may have a value of 0, 1, 2, or 3, each of which corresponds to a different sequence of RVs (e.g., a different order for RV0, RV1, RV2, and RV3).

Similarly, for PUSCH Repetition Type B, if the base station indicates an RV index of 0, then the UE 120 may determine an RV to be applied to an nth actual repetition (of PUSCH Repetition Type B) by calculating n mod 4. If n mod 4=0 (for actual repetition 0), then the UE applies RV0 to that actual repetition. If n mod 4=1 (for actual repetition 1), then the UE applies RV2 to that actual repetition. If n mod 4=2 (for actual repetition 2), then the UE applies RV3 to that actual repetitions. If n mod 4=3 (e.g., for actual repetition 3), then the UE applies RV1 to that actual repetition.

Some techniques described herein use multi-slot transmission occasions, such as multi-slot PUSCH occasions. In such examples, RVs may be assigned per PUSCH (such that a PUSCH occupying a plurality of contiguous slots on a multi-slot transmission occasion has a given RV), or per segment (such that a segment associated with a PUSCH, occupying multiple sets of contiguous slots, is associated with a given RV). In such a case, RV indexes may be incremented according to how RVs are assigned (that is, per PUSCH, per segment, or per slot, such as for each slot of a multi-slot transmission). Multi-slot transmission occasions are described in more detail below.

In some aspects, RV bundling may be used. For example, when a PUSCH is configured with Type A repetition, RV cycling may be used. In RV cycling, RV indexes are refreshed for every slot or every repetition of a PUSCH. For a multi-slot uplink shared channel transmission, an RV index may be used across multiple slots. A group of multiple slots for which the same RV index is used may be referred to as "bundled" or "associated with RV bundling."

For an RV bundle, the same RV index may be used across multiple slots or repetitions. Thus, coded bits to be transmitted across the multiple slots may be chosen in a contiguous manner based at least in part on a single RV index, as described elsewhere herein. The number of slots across which a single RV index is used is governed by an RV bundle size. The RV bundle size may be specified in terms of slots or repetitions, and may be counted based at least in part on slots including actual transmissions. Rate matching for RV bundling may be performed per slot. RV bundling may be indicated separately for dynamic grants (DGs) and configured grants (CGs).

If RV bundling is used, per slot rate matching may be performed, as mentioned above. For per slot rate matching to be successful, the UE and the base station should be synchronized with regard to start locations of rate matching in the circular buffer used to perform rate matching. However, there are situations where the UE and the base station may have different information regarding start locations in the circular buffer. For example, in some cases, uplink control information (UCI) may be multiplexed with a multi-slot uplink shared transmission on a slot. UCI multiplexing alters the number of rate matched bits transmitted in a slot. To maintain proper rate matching and decoding, the UE and the base station may need to be in sync on how resources are partitioned between the UCI and an uplink shared channel (UL-SCH) of the multi-slot uplink shared transmission. However, differences in understanding between the UE and the base station can arise, for example, in the case when the UE misses a sequence of downlink control information (DCI) transmissions and is thus unaware that UCI should be transmitted. Once a misunderstanding regarding circular buffer start location occurs, each subsequent slot of an RV bundle may be negatively impacted. For example, the start location of a second slot is generally immediately after a last bit that was read for a first slot. Thus, a misunderstanding can propagate through the second slot and each subsequent slot, causing failure to receive uplink communications on each of the second slot and the subsequent slots, and diminished throughput.

Some techniques and apparatuses described herein enable determination of starting locations in a circular buffer for RV bundled slots of a multi-slot uplink shared transmission. For example, the UE and/or the base station may determine the starting locations for a group of slots independently of each other. Put another way, the UE and/or the base station may decouple the process of determining start locations for each slot of a multi-slot uplink shared transmission. In some aspects, the UE and/or the base station may determine (e.g., precompute) the start locations prior to the start of transmission, and may not revise the start locations irrespective of whether UCI is multiplexed or a cancellation occurs. Thus, throughput is improved and reliability of uplink communications is improved. Furthermore, a misunderstanding regarding a start location or end location of a bit selection operation is localized to a single slot rather than impacting all subsequent slots.

Figure 5:
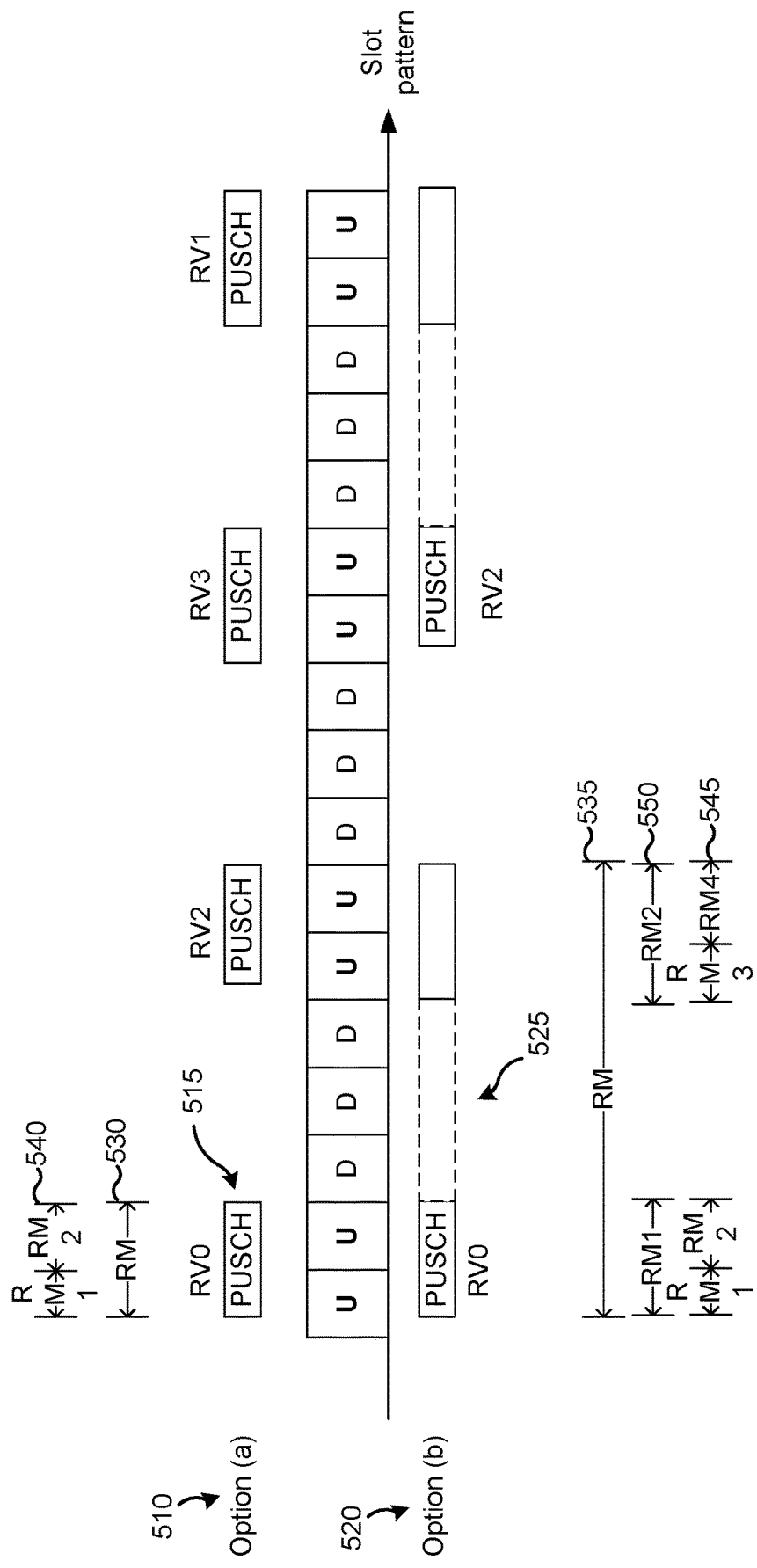
FIG. 5 is a diagram illustrating an example of multi-slot uplink shared channel transmission in accordance with the present disclosure.

FIG. 5 is a diagram illustrating an example of multi-slot uplink shared channel transmission in accordance with the present disclosure. Slots are labeled as "U," indicating an uplink slot (that is, a slot with a threshold number of configured or indicated uplink symbols), or "D," indicating a downlink slot (that is, a slot with a threshold number of configured or indicated downlink symbols). Two options are depicted for a UE to transmit PUSCH repetitions over a set of contiguous time domain resources, where the PUSCH repetitions span multiple slots and/or multiple segments, as described in further detail herein. PUSCH repetitions that span multiple slots or multiple segments may be referred to herein as multi-slot PUSCH transmissions. Although techniques are described herein in connection with PUSCH repetitions and multi-slot PUSCH transmissions, these techniques can be applied to various types of uplink repetitions, such as an uplink data repetition, an uplink control repetition (such as physical uplink control channel (PUCCH) repetition), or the like.

A repetition, such as an uplink repetition or a downlink repetition, may be used to improve reliability, such as for ultra reliable low latency communication (URLLC) or for UEs located in a geographic area with poor channel conditions (such as a cell edge). When repetitions are used, a transmitter repeats transmission of a communication multiple times. For example, a UE may transmit an initial uplink communication and may repeat transmission of (that is, may retransmit) that uplink communication one or more times. Each repetition may include different encoded bits in accordance with different RVs, as described herein. Therefore, a receiver can attempt to combine multiple repetitions to improve the likelihood of successfully decoding a payload of the multiple repetitions.

As used herein, the term "repetition" is used to refer to the initial communication and is also used to refer to a repeated transmission of the initial communication. For example, if a UE is configured to transmit four repetitions, then the UE may transmit an initial transmission and may transmit three repeated transmissions of that initial transmission. Thus, each transmission (regardless of whether the transmission is an initial transmission or a retransmission) is counted as a repetition. A repetition may be transmitted in a transmission occasion, which is sometimes referred to as a transmission instance. In these examples, a transmission occasion is a multi-slot transmission occasion, which facilitates the transmission of multi-slot PUSCH transmissions.

For a first type of multi-slot PUSCH transmission, shown at 510 and referred to as Option (a), each repetition and each multi-slot transmission occasion spans a set of contiguous resources (such as symbols or slots). Option (a) may enable, for example, a UE to transmit a transport block, spanning a set of contiguous slots, in a single transmission occasion. For example, for a first multi-slot PUSCH transmission 515 that includes a codeblock associated with RV0, the repetition is shown spanning a set of two contiguous slots. As used herein "spanning across a set of contiguous slots" means "including at least one symbol of each slot of the set of contiguous slots."

For a second type of multi-slot PUSCH transmission, shown at 520 and referred to as Option (b), each repetition spans two or more segments, and a segment includes a set of contiguous slots. Option (b) may enable, for example, a UE to transmit a transport block, spanning multiple sets of contiguous slots, in a single transmission occasion. For example, for a second multi-slot PUSCH transmission 525 that includes a codeblock associated with RV0, the repetition is shown spanning two sets of contiguous slots. Thus, the repetition is transmitted on two segments of the transmission occasion, where a first segment occupies at least part of the first and second slots of the slot pattern, and a second segment occupies at least part of the sixth and seventh slots of the slot pattern.

In some aspects, RV cycling may be performed on a per slot basis. For example, each slot of a multi slot transmission occasion may be assigned a respective RV index. In some aspects, RV cycling may be performed on a per transmission occasion basis. For example, each transmission occasion may be assigned a respective RV index. In some aspects, RV cycling may be performed on a per segment basis. For example, each segment of a transmission occasion may be assigned a respective RV index.

In some aspects, as mentioned elsewhere herein, rate matching (shown as "RM") may be performed on a per transmission occasion basis. Per transmission occasion rate matching is shown by reference number 530 for option (a) and reference number 535 for option (b). In other aspects, as mentioned elsewhere herein, rate matching may be performed on a per slot basis. For option (a), shown by reference number 540, first rate matching may be performed for a first slot of a transmission occasion and second rate matching may be performed for a second slot of a transmission occasion. For option (b), shown by reference number 545, respective rate matching may be performed for each slot of a transmission occasion (that is, twice for the two slots of the first segment and twice for the two slots of the second segment). In yet other aspects, as mentioned elsewhere herein and as shown by reference number 550, rate matching may be performed on a per segment basis.

Figure 6:
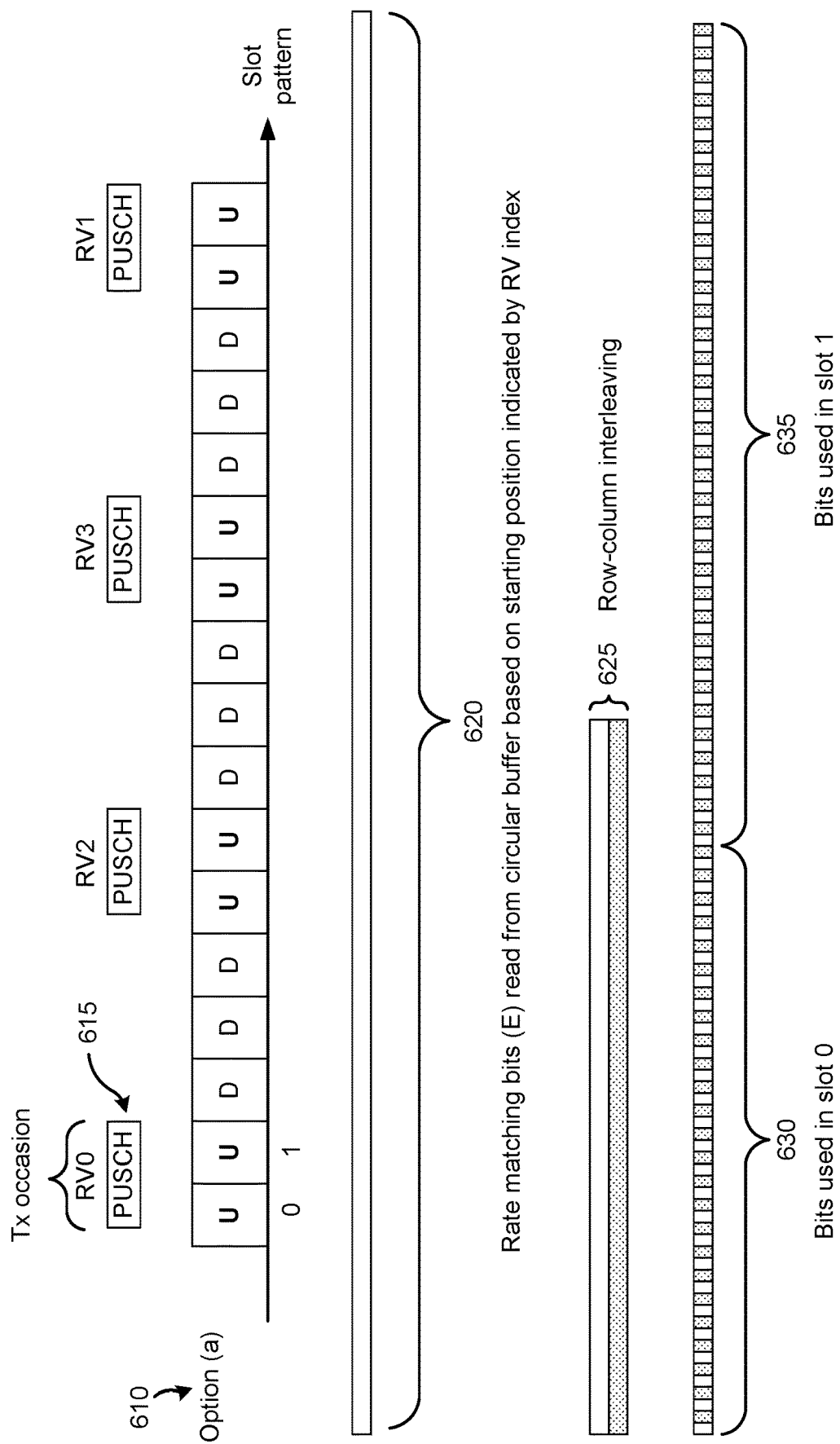
FIG. 6 is a diagram illustrating an example of a per transmission occasion interleaver design for multi-slot uplink shared channel transmission in accordance with the present disclosure.

FIG. 6 is a diagram illustrating an example of a per transmission occasion interleaver design for multi-slot uplink shared channel transmission in accordance with the present disclosure. A UE may interleave a codeblock of bits for transmission to another device, such as a base station. The interleaver process is designed to improve transmission performance, for example, by distributing transmitted bits over time to achieve a desirable bit error distribution. For example, a set of bits are mapped to a modulation symbol. Not all bits mapped to a modulation symbol are carried with equal reliability. An interleaver uses the differences between reliability of bits mapped to a modulation symbol, and places information bits such that the bits occupy locations that enjoy higher reliability before being mapped to modulation symbols.

As shown by reference number 610, a UE may use the first type of multi-slot PUSCH transmission, referred to as Option (a), to transmit encoded bits of a PUSCH that spans at least multiple slots. In this example, a first multi-slot PUSCH transmission occasion 615 (also referred to as a multi-slot transmission occasion) spans a set of two contiguous slots (slot 0 and slot 1) and includes bits that correspond to RV0. The UE may obtain a codeblock 620 for the first multi-slot PUSCH transmission occasion 615 from a circular buffer based at least in part on a starting position indicated by the RV index of RV0. For example, the UE may select rate matching bits (represented by E) from the circular buffer to obtain the codeblock 620. As shown by reference number 625, the UE may perform interleaving on the codeblock to form a plurality of interleaved encoded bit sequences having data re-arranged via one or more interleaving processes described herein, such as row-column interleaving. As shown, interleaving the codeblock distributes the bits of the codeblock across the two slots of the multi-slot PUSCH transmission occasion, resulting in a first subset 630 of the plurality of coded bits being transmitted via a first slot (slot 0) of the multi-slot PUSCH transmission occasion and a second subset 635 of the plurality of coded bits being transmitted via a second slot (slot 1) of the multi-slot PUSCH transmission occasion 615. After interleaving, the UE may transmit the coded bits via the multi-slot PUSCH transmission occasion 615. For example, the UE may concatenate the coded and interleaved bits across all the codeblocks and transmit the entire encoded transport block.

In some aspects, interleaving may be performed on a per transmission occasion basis (as in FIG. 6) and RV cycling may be performed on a per slot basis. In other aspects, interleaving may be performed on a per transmission occasion basis and RV cycling may be performed on a per transmission occasion basis. In other aspects, interleaving may be performed on a per transmission occasion basis and RV cycling may be performed on a per segment basis.

The interleaving process improves transmission performance. However, when a PUSCH or other transmission spans multiple slots, a UE may need to store the state of the transmission across slots. In addition, the UE may need to store information indicating how much of an interleaved sequence was transmitted while also saving the non-transmitted sequence. This increases the complexity involved and the resources used by the UE when interleaving and transmitting a PUSCH over multiple slots, which may lead to the UE inefficiently consuming power, communication, network, and computing resources to interleave multi slot transmissions, and which may make UCI multiplexing inefficient or infeasible.

Various aspects relate generally to codeblock interleaving for multi-slot uplink shared channel transmissions on a per slot or per segment basis. Some aspects more specifically relate to selecting, for a codeblock of a PUSCH transmission communication that spans across multiple slots, coded bits on a per slot or per segment basis, and interleaving the coded bits on the per slot of per segment basis. In some aspects, for PUSCH transmission occasions that span multiple slots, a UE may interleave bits of the PUSCH for each of the multiple slots. In some aspects, for PUSCH transmission occasions that span multiple segments, each including multiple slots, a UE may interleave bits of the PUSCH for each segment.

Particular aspects of the subject matter described in this disclosure can be implemented to realize one or more of the following potential advantages. In some examples, the described techniques can be used to improve the quality and performance of network transmissions, such as PUSCH or other transmissions that span multiple slots. In addition, the use of codeblock interleaving for multi-slot uplink shared channel transmissions on a per slot or per segment basis may reduce the complexity of current UE interleaving processes and provides efficiency improvements for a UE, which may enable the UE to more efficiently consume power, communication, network, and computing resources, and to perform UCI multiplexing while reducing the latencies involved in the decision making process related to UCI multiplexing.

Figure 7:
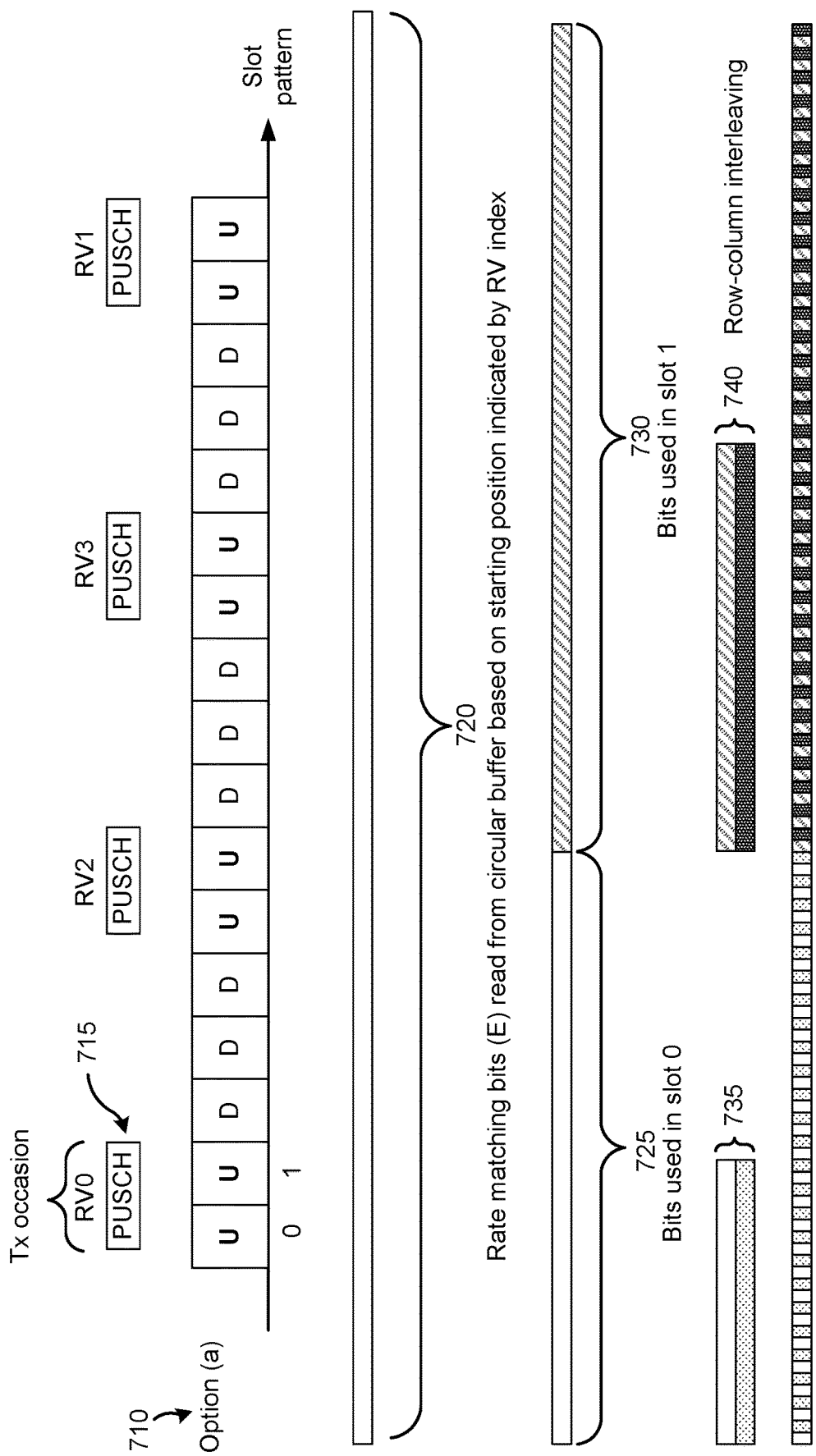
FIG. 7 is a diagram illustrating an example of a per slot interleaver design for multi-slot uplink shared channel transmission in accordance with the present disclosure.

FIG. 7 is a diagram illustrating an example of a per slot interleaver design for multi-slot uplink shared channel transmission in accordance with the present disclosure.

A UE may use the first type of multi-slot PUSCH transmission, Option (a) (indicated by 710), to transmit encoded bits of a PUSCH that spans at least multiple slots, including slot 0 and slot 1. In this example, a first multi-slot PUSCH transmission occasion 715 spans a set of two contiguous slots and includes bits that correspond to RV0. the UE may obtain a codeblock 720 for the first multi-slot PUSCH transmission occasion 715 from a circular buffer based at least in part on a starting position indicated by the RV index. As shown, the UE may select a portion of the codeblock to be used for each slot of the multi-slot PUSCH transmission occasion on a per slot basis, selecting a first subset 725 of the selected bits for transmission via a first slot (slot 0) of the multi-slot PUSCH transmission occasion and a second subset 730 of the selected bits for transmission via a second slot (slot 1) of the multi-slot PUSCH transmission occasion 715.

As shown, the UE may perform interleaving on each portion of the codeblock to form two sequences of interleaved encoded bits 735 and 740 having data re-arranged via one or more interleaving processes described herein. As shown, interleaving subsets of the codeblock 720 distributes the bits of the original codeblock across the two slots of the multi-slot PUSCH transmission occasion, with each slot being associated with data interleaved via separate interleaving processes. After interleaving, the UE may transmit the encoded bits via the multi-slot PUSCH transmission occasion. For example, the UE may concatenate the coded and interleaved bits to form a codeblock and may transmit the codeblock.

In some aspects, interleaving may be performed on a per slot basis (as in FIG. 7) and RV cycling may be performed on a per slot basis. In other aspects, interleaving may be performed on a per slot basis and RV cycling may be performed on a per transmission occasion basis. In yet other aspects, interleaving may be performed on a per slot basis and RV cycling may be performed on a per segment basis.

Particular aspects of the subject matter described in this disclosure can be implemented to realize one or more of the following potential advantages. In some examples, the described techniques can be used to improve the quality and performance of network transmissions, such as PUSCH or other transmissions that span multiple slots. When selecting bits and performing interleaving on a per slot basis, a UE may incur reduced overhead in that only a starting position within a circular buffer is stored for each slot, reducing the need to store additional information regarding the state of a transmission. In addition, there may be no need to buffer bits to be transmitted, as preserving the circular buffer suffices to referencing rate matched bits. Selecting bits and performing interleaving on a per slot basis also enables UCI multiplexing to be performed on a per slot basis. In this way, the use of codeblock interleaving for multi-slot uplink shared channel transmissions on a per slot basis may reduce the complexity of current UE interleaving processes and provides efficiency improvements for a UE, which may enable the UE to more efficiently consume power, communication, network, and computing resources.

Figure 8:
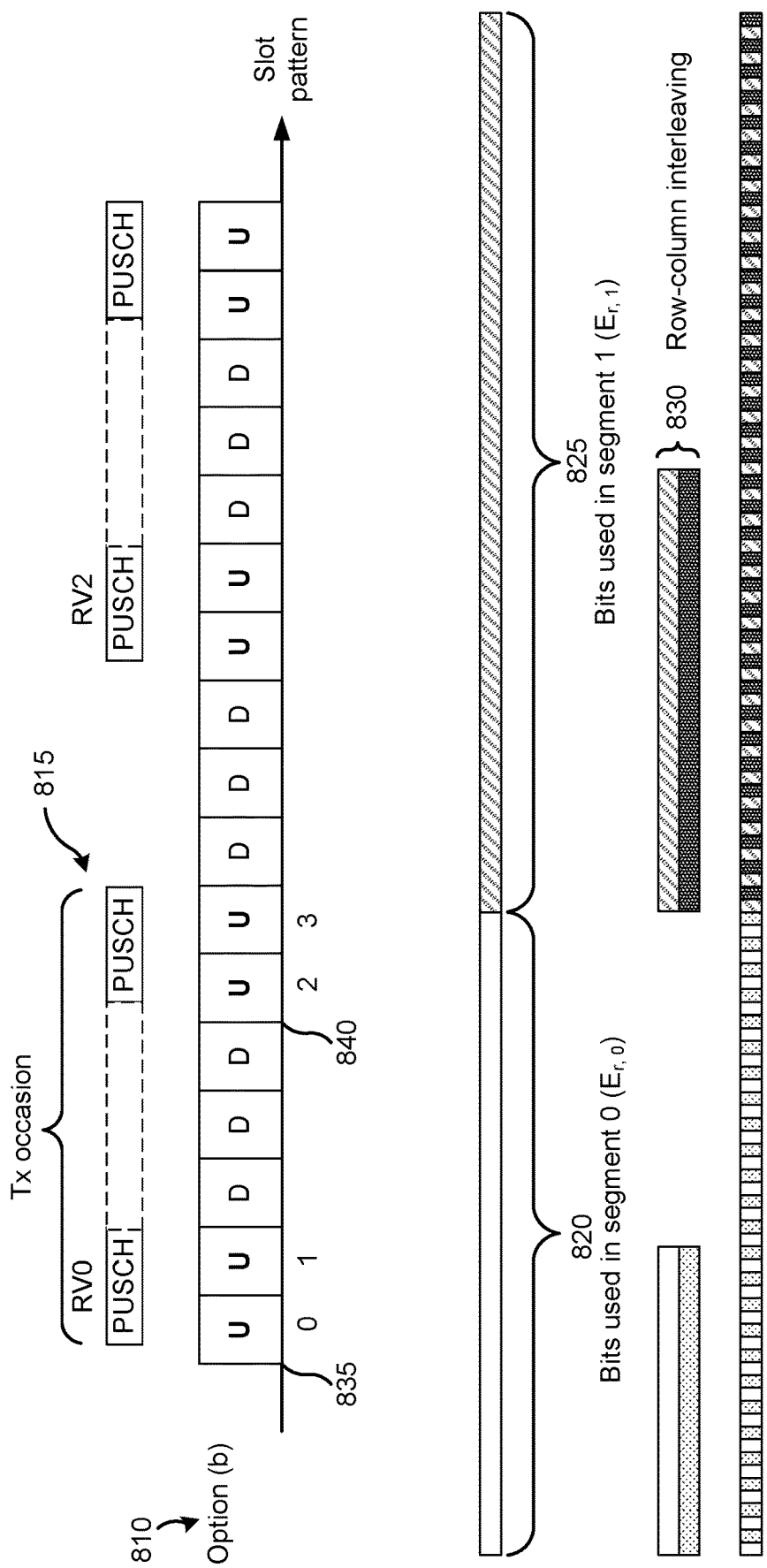
FIG. 8 is a diagram illustrating an example of a per segment interleaver design for multi-slot uplink shared channel transmission in accordance with the present disclosure.

FIG. 8 is a diagram illustrating an example of a per segment interleaver design for multi-slot uplink shared channel transmission in accordance with the present disclosure.

A UE may use the second type of multi-slot PUSCH transmission, Option (b) (indicated at 810), to transmit encoded bits of a PUSCH that spans at least multiple segments, or sets, of multiple contiguous slots. In this example, a first multi-slot PUSCH transmission occasion 815 spans two segments, each segment corresponding to two contiguous slots. Further, the first multi-slot PUSCH transmission occasion 815 includes bits that correspond to RV0. As shown, the UE may obtain rate matching bits 820 and 825 (composed of rate matching bits represented by $E_{r,p}$) for the first multi-slot PUSCH transmission occasion 815 from a circular buffer based on a starting position indicated by the RV index. An example of circular buffer reading and bit selection for per segment rate matching is shown by reference number 1105 of FIG. 11. As shown, the UE may determine parameters for rate matching for a first segment 1145, and the UE may identify and read rate matching bits from the circular buffer (starting at the starting position indicated by the RV index) in accordance with the parameters for rate matching for the first segment 1145. The UE may save (e.g., to memory) a point 1150 in the circular buffer at which the UE ceases reading the bits rate matching bits for the first segment 1145. Then, the UE may determine parameters for rate matching for a second segment 1155, and the UE may identify and read rate matching bits from the circular buffer in accordance with the parameters for rate matching for the second segment 1155 starting at the point 1150 in the circular buffer that was saved by the UE. For example, the UE may read bits consumed in the first segment 1145 from the circular buffer, then may read bits consumed in the second segment 1155 from the circular buffer. Thus, per segment rate matching is enabled.

For per segment rate matching, the UE may perform rate matching across each segment of the first multi-slot PUSCH transmission occasion 815. For example, G (described in connection with FIG. 3, above) may be defined as the actual number of transmission bits available per segment (that is, $G_p$). $E_r$ may be defined as the number of coded bits of the rth codeblock to be transmitted in a given segment (that is, $E_{r,p}$).

The below algorithm is an example of how per segment rate matching may be performed. The below algorithm can be applied for each segment of a transmission occasion using option (b), as shown in FIG. 8.

Denoting by $E_{r,p}$ the rate matching output sequence length for the r-th coded block in segment p, where the value of $E_{r,p}$ is determined as follows:

```
Set j = 0
for r = 0 to C - 1
    if the r -th coded block is not scheduled for transmission as indicated
       by CBGTI according to Clause 5.1.7.2 for DL-SCH and 6.1.5.2 for
       UL-SCH in [6, TS 38.214]
        E_{r,p} = 0;
    else
        if j ≤ C' - mod(G_p/(N_L · Q_m), C') - 1
```

$$E_{r,p} = N_L \cdot Q_m \cdot \left\lfloor \frac{G_p}{N_L \cdot Q_m \cdot C'} \right\rfloor;$$

```
        else
```

$$E_{r,p} = N_L \cdot Q_m \cdot \left\lceil \frac{G_p}{N_L \cdot Q_m \cdot C'} \right\rceil;$$

```
        end if
        j = j+1;
    end if
end for
``` where $N_L$ is the number of transmission layers that the transport block is mapped onto;

$Q_m$ is the modulation order;

$G_p$ is the total number of coded bits available for transmission of the transport block in the $p^{th}$ segment of the transmission occasion;

C'=C if CBGTI is not present in the DCI scheduling the transport block and c' is the number of scheduled code blocks of the transport block if CBGTI is present in the DCI scheduling the transport block.

Denote by $rv_{id}$ the redundancy version number for this transmission ($rv_{id}$=0, 1, 2 or 3), the rate matching output bit sequence $e_k$, k=0, 1, 2, ..., E−1, is generated as follows, where $k_{0,p}$ is given by Table 5.4.2.1-2 according to the value of $rv_{id}$ and LDPC base graph when p=1 and is otherwise computed as $k_{0,p}=W_{p-1}+k_{0,p-1}$ where $$W_{p-1} = \min_r E_{r,p-1} \text{ OR } W_{p-1} = \max_r E_{r,p-1}:$$

```
k = 0 ;
j = 0;
while k < E
    if d_{(k_{0,r,p}+j) mod N_{cb}} ≠< NULL >
        e_k = d_{(k_{0,r,p}+j) mod N_{cb}};
        k = k + 1 ;
    end if
    j = j+1;
end while
```

In some aspects, rate matching output bit sequence $e_k$ may be determined as follows:

Denote by $rv_{id}$ the redundancy version number for this transmission ($rv_{id}$=0, 1, 2 or 3), the rate matching output bit sequence $e_k$, k=0, 1, 2, ..., E−1, for the $r^{th}$ codeblock of $p^{th}$ segment is generated as follows, where $k_{0,r,p}$ is given by Table 5.4.2.1-2 according to the value of $rv_{id}$ and LDPC base graph when p=1 and is otherwise computed as $k_{0,r,p}=E_{r,p-1}+k_{0,r,p-1}$:

```
k = 0 ;
j = 0;
while k < E
    if d_{(k_{0,r,p}+j) mod N_{cb}} ≠< NULL >
        e_k = d_{(k_{0,r,p}+j) mod N_{cb}};
        k = k + 1 ;
    end if
    j = j+1;
end while
```

Figure 11:
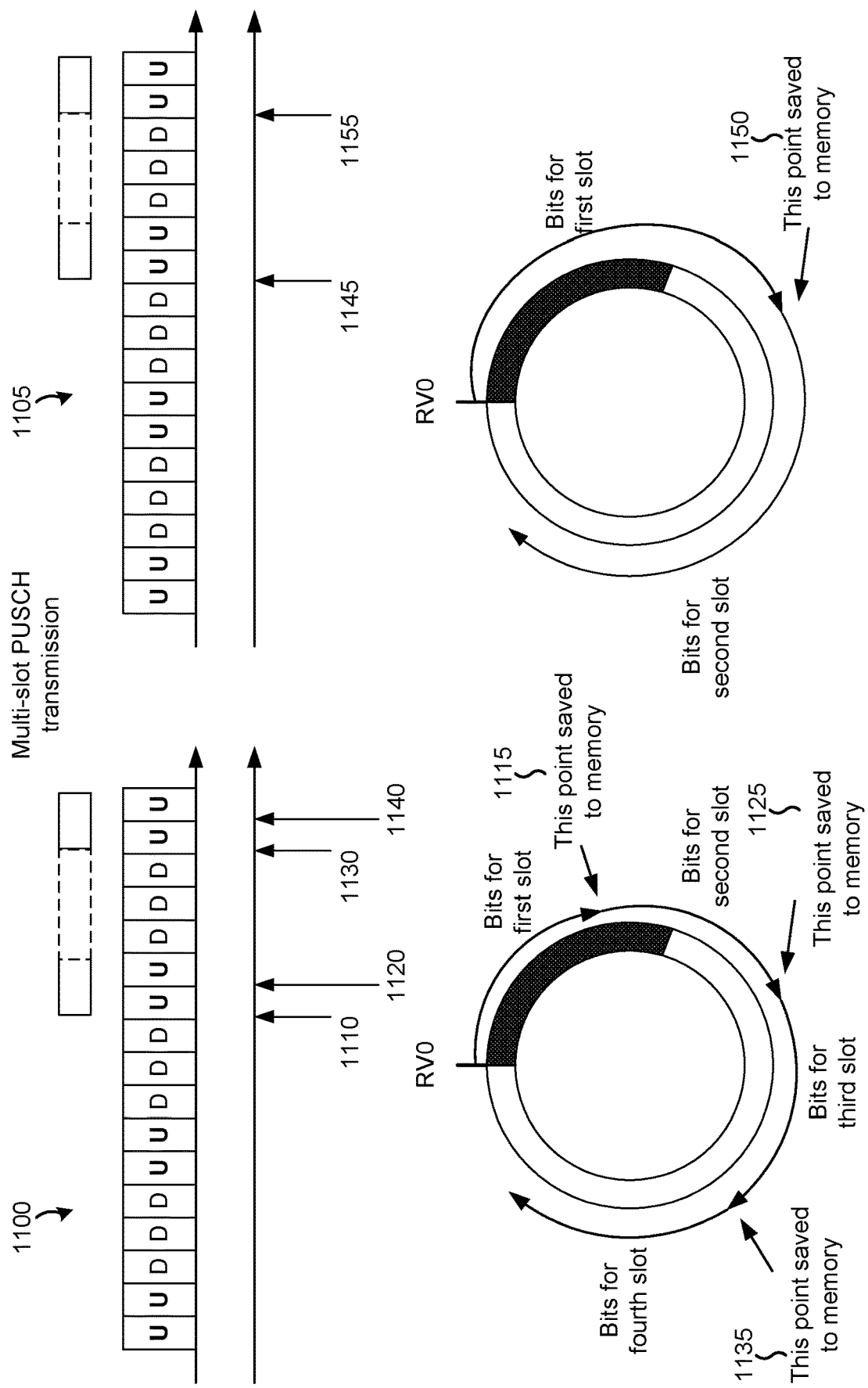
FIG. 11 is a diagram illustrating an example of per slot and per segment rate matching for a multi-slot uplink shared channel transmission in accordance with the present disclosure.

FIG. 11 shows an example 1100 of per slot rate matching for option (b). As shown, the UE may determine parameters for rate matching for a first slot of the first segment 1110 (labeled slot 0), and the UE may identify and read rate matching bits from the circular buffer (starting at the starting position indicated by the RV index) in accordance with the parameters for rate matching for the first slot of the segment 1110. The UE may save (e.g., to memory) a first point 1115 in the circular buffer at which the UE ceases reading the bits rate matching bits for the first slot of the first segment 1110. Then, the UE may determine parameters for rate matching for a second slot of the first segment 1120 (labeled slot 1), and the UE may identify and read rate matching bits from the circular buffer in accordance with the parameters for rate matching for the second slot of the first segment 835 starting at the first point 1115 in the circular buffer. The UE may save (e.g., to memory) a second point 1125 in the circular buffer at which the UE ceases reading the bits rate matching bits for the second slot of the first segment 1110. The UE may determine parameters for rate matching for a first slot 840 of the second segment 1130 and may identify and read rate matching bits from the circular buffer (starting at the second point 1125) in accordance with the parameters for rate matching for the first slot of the second segment 1130. The UE may save (e.g., to memory) a third point 1135 in the circular buffer at which the UE ceases reading the bits rate matching bits for the first slot of the second segment 1130. Then, the UE may determine parameters for rate matching for a second slot of the second segment 1140 and may identify and read rate matching bits from the circular buffer in accordance with the parameters for rate matching for the second slot of the second segment 1140 starting at the third point 1135 in the circular buffer. For example, the UE may read only bits consumed in a given slot for rate matching of the given slot.

In some aspects, the UE may perform per slot rate matching with RV cycling. For example, consider a multi-slot PUSCH transmission occasion with four non-contiguous segments of two slots each. The UE may perform per slot rate matching and interleaving (as described above) for each of a plurality of first slots (such as each slot of a first N segments of the four segments) using a first RV index. The UE may then perform per slot rate matching and interleaving for each of a plurality of second slots (such as each slot of a remainder of the four segments) using a second RV index. In some aspects, the plurality of first slots may be based at least in part on a sequence of slots, such as information indicating a number of slots for which the per slot rate matching is to be performed before moving to a next RV index in an RV cycle.

In the case of per transmission occasion rate matching, the UE may determine parameters for rate matching for the first multi-slot PUSCH transmission occasion 815, and may identify and read rate matching bits from the circular buffer (starting at the starting position indicated by the RV index) in accordance with the parameters for rate matching for the first multi-slot PUSCH transmission occasion 815. For example, the UE may read all bits for rate matching of the transmission occasion (no matter how many slots or segments are included in the transmission occasion) at once.

As shown by reference number 830, the UE may perform interleaving on each set of encoded bits to form two sequences of interleaved encoded bits having data re-arranged via one or more interleaving processes described herein. As shown, each segment is associated with data interleaved via separate interleaving processes. After interleaving, the UE may transmit the encoded bits via the multi-slot PUSCH transmission occasion, which includes both segments.

In some aspects, interleaving may be performed on a per segment basis (as in FIG. 8), and RV cycling may be performed on a per segment basis. In other aspects, interleaving may be performed on a per segment basis and RV cycling may be performed on a per transmission occasion basis.

In some aspects, the UE may determine whether to perform interleaving. For example, the UE may determine whether to perform interleaving based at least in part on a condition at the UE or based at least in part on an indication from the base station. In some aspects, the determination of whether to perform interleaving (whether determined by the UE or signaled by the base station) may be based at least in part on a modulation and coding scheme (MCS) of the communication. For example, if the MCS satisfies a threshold, then the UE may perform interleaving, and if the MCS fails to satisfy the threshold, then the UE may not perform interleaving. In some aspects, the threshold may be an MCS associated with 16 quadrature amplitude modulation (16QAM). For example, the UE may not perform interleaving for communications associated with BPSK or quadrature phase shift keying (QPSK) and may perform interleaving for communications of 16QAM or above. This may be beneficial because interleaving can generally be deactivated for lower modulation schemes without significant detrimental impact, which conserves resources of the UE associated with interleaving and the base station associated with de-interleaving.

Particular aspects of the subject matter described in this disclosure can be implemented to realize one or more of the following potential advantages. In some examples, the described techniques can be used to improve the quality and performance of network transmissions, such as PUSCH or other transmissions that span multiple slots. When selecting bits and performing interleaving on a per segment basis, the UE may incur reduced overhead in that only a starting position within a circular buffer is stored for each slot, reducing the need to store additional information regarding the state of a transmission. In addition, there may be no need to buffer bits to be transmitted, as preserving the circular buffer suffices to referencing rate matched bits. In this way, the use of codeblock interleaving for multi-slot uplink shared channel transmissions on a per slot or per segment basis may reduce the complexity of current UE interleaving processes and provides efficiency improvements for a UE, which may enable the UE to more efficiently consume power, communication, network, and computing resources.

While the interleaving techniques described in connection with FIGS. 6, 7, and 8 are primarily described in the context of uplink communications, these techniques can also be applied for downlink communications.

Figure 9:
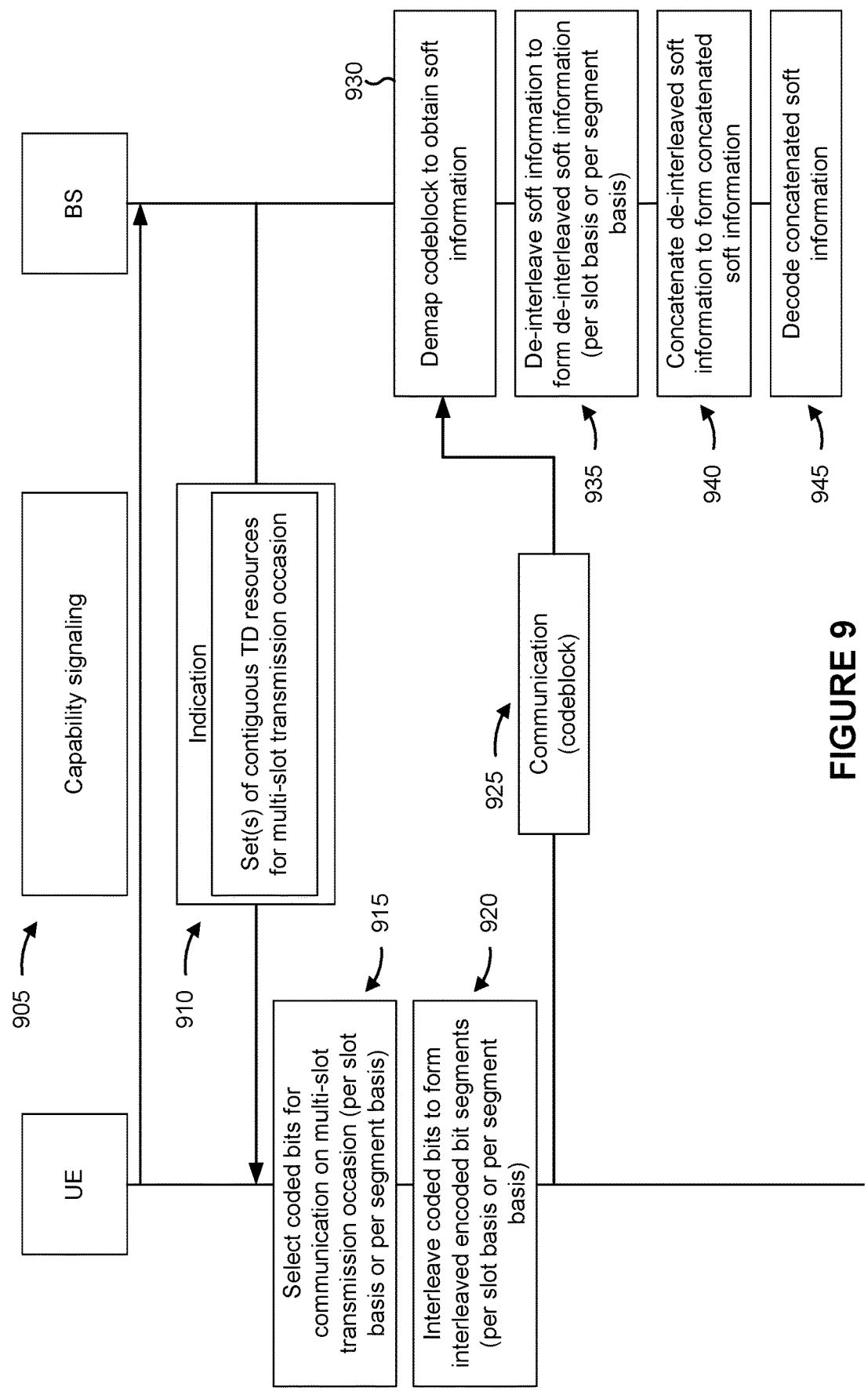
FIG. 9 is a diagram illustrating an example of signaling associated with multi-slot uplink shared channel transmission in accordance with the present disclosure.

FIG. 9 is a diagram illustrating an example of signaling associated with multi-slot uplink shared channel transmission in accordance with the present disclosure. As shown in FIG. 9, a UE (e.g., UE 120) may communicate (e.g., transmit an uplink transmission and/or receive a downlink transmission) with a base station (e.g., base station 110). In some aspects, the UE may communicate with another UE via one or more sidelink communications (e.g., in addition to, or in place of, communicating with the base station). The UE and the base station may be part of a wireless network (e.g., wireless network 100).

In a first operation 905, the UE may transmit, and the base station may receive, capability signaling. The capability signaling may identify one or more capabilities of the UE. For example, the capability signaling may indicate one or more features supported by the UE.

In some aspects, the capability signaling may indicate whether the UE supports multi-slot transmission of a transport block. For example, the capability signaling may indicate that the UE supports multi-slot transmission of a transport block with contiguous resources only and a single-codeblock transmission. As another example, the capability signaling may indicate that the UE supports multi-slot transmission of a transport block with contiguous or non-contiguous resources and a single-codeblock transmission. As yet another example, the capability signaling may indicate that the UE supports multi-slot transmission of a transport block with contiguous resources only and with multiple-codeblock transmission. As still another example, the capability signaling may indicate that the UE supports multi-slot transmission of a transport block with contiguous or noncontiguous resources and with a multiple-codeblock transmission.

In some aspects, the capability signaling may indicate support for a rate matching configuration. A rate matching configuration may include per slot rate matching, per transmission occasion rate matching, or per segment rate matching. For example, the UE may transmit capability signaling indicating support for one or more of per slot rate matching (e.g., which may be conditioned on resources of the transmission occasion being contiguous, and/or on a single-codeblock transmission) or per segment rate matching (e.g., which may be conditioned on resources of the transmission occasion being contiguous, and/or on a single-codeblock transmission).

In some aspects, the capability signaling may indicate support associated with interleaving. For example, the capability signaling may indicate whether the UE is capable of dynamically turning on or off (e.g., activating or deactivating) an interleaver. For example, the UE may determine whether to activate or deactivate the interleaver based at least in part on a multi-slot transmission of a transport block (e.g., all instances may have the interleaver turned off) or based at least in part on a multi-slot transmission of a transport block that spans non-contiguous resources.

In a second operation 910, the base station may transmit, and the UE may receive, an indication of one or more sets of contiguous time domain resources for a multi-slot transmission (MST) occasion that spans at least multiple slots. In some aspects, the UE may receive the indication from another device (e.g., from another base station or another UE). In some aspects, the indication may indicate that the base station is capable of receiving codeblocks transmitted using one or more types of bit selection and interleaving processes described herein. The indication may be provided via radio resource control (RRC) signaling, MAC signaling, DCI, a combination thereof, or the like. In some aspects, the indication may include configuration information for the MST occasion. Additionally or alternatively, the indication may include scheduling information for a transmission on the MST occasion.

In some aspects, the one or more sets of contiguous time domain resources for the MST occasion may include (such as consist of) a single set of contiguous time domain resources that span multiple slots, the multiple slots being contiguous with one another (as in option (a) described above with reference to FIGS. 5, 6, and 7). In other aspects, the one or more sets of contiguous time domain resources for the MST occasion may include multiple sets of contiguous time domain resources. In such examples, each set of contiguous time domain resources may span two or more contiguous slots, and different sets of contiguous time domain resources are not contiguous with one another. In addition, each set of contiguous time domain resources, of the multiple sets of contiguous time domain resources, may be associated with a corresponding segment (as in option (b) described above with reference to FIGS. 5 and 8).

In some aspects, the UE and/or the base station may trigger per slot rate matching or per segment rate matching. For example, the UE may autonomously trigger the per slot rate matching or per segment rate matching, or the base station may transmit signaling to the UE triggering the per slot rate matching or the per segment rate matching. In some aspects, the UE and/or the base station may determine a rate matching type or configuration (e.g., per slot rate matching, per segment rate matching, or per transmission occasion rate matching). In some aspects, per slot rate matching may be a default mode of operation for multi-slot transmissions irrespective of whether a resource allocation for the multi-slot transmission is contiguous or not, and irrespective of whether a transport block of the multi-slot transmission can be encoded in a single codeblock or multiple codeblocks. In some aspects, per slot rate matching may be triggered if a multi-slot transmission occasion spans noncontiguous resources. In some aspects, per slot rate matching may be triggered if a multi-slot transmission's transport block is encoded across multiple codeblocks. In some aspects, the base station may transmit signaling indicating a rate matching type. For example, a rate matching type for a multi-slot transmission may be RRC configured.

In some aspects, the UE and/or the base station may trigger per slot rate matching or per segment rate matching based at least in part on a restriction on per slot or per segment rate matching. The restriction may indicate a number of slots or segments for which rate matching can occur (such as a sequence of slots or segments for which rate matching can be performed). For example, the restriction may indicate that per slot rate matching or per segment rate matching cannot span more than K uplink slots (where K is an integer). In some aspects, the restriction may indicate that per slot rate matching or per segment rate matching cannot span more than K slots where a multi-slot transmission occurs. In some aspects, the restriction may indicate that per slot rate matching or per segment rate matching cannot span across semi-static downlink slots. In some aspects, the restriction may indicate that per slot rate matching or per segment rate matching cannot span across noncontiguous slots. Once per slot or per segment rate matching across a sequence of slots is terminated, rate matching for a next set of slots may be governed by a new RV index, and per slot or per segment rate matching may resume. Thus, the UE or the base station may implement per slot or per segment rate matching with RV cycling.

In a third operation 915, the UE may select coded bits for communication on an MST occasion on a per slot basis or per segment basis. For example, in some aspects, the UE may select, for one or more codeblocks of a communication on an MST occasion, coded bits of multiple coded bits, on a per slot basis for each of multiple slots, or a per segment basis for each of multiple segments, where each segment spans multiple slots and includes one of the sets of contiguous time domain resources. In some aspects, the selected bits may be interleaved to form a codeblock (such as one or more codeblocks), as described below.

In some aspects, when selecting the coded bits on the per slot basis, the UE may select a first subset of the multiple bits for a first slot of the MST occasion and select a second subset of the multiple bits for a second slot of the MST occasion. In such examples, the first slot and the second slot may be contiguous.

In some aspects, when selecting the coded bits on the per segment basis, the UE may select a first subset of the multiple bits for a first segment of the MST occasion and select a second subset of the multiple bits for a second segment of the multi-slot transmission occasion. In such examples, the first and second segments may be associated with a single physical channel.

In some aspects, the communication is a PUSCH transmission that includes a single transport block, and the multi-slot transmission occasion is a multi-slot PUSCH transmission. In some aspects, the codeblock may be one of multiple codeblocks of the communication. In such examples, selecting the coded bits on the per slot basis or the per segment basis may be based at least in part on the codeblock spanning across two slots or two segments. For example, the UE may not need to select coded bits on the per slot or per segment basis in a situation where the codeblock would not span multiple slots or segments.

In a fourth operation 920, the UE may interleave the coded bits, on a per slot basis or a per segment basis, to form one or more interleaved encoded bit sequences. For example, when interleaving on a per slot basis over multiple contiguous slots, the UE may perform a separate interleaver process on the coded bits of each of the slots, as described in connection with FIG. 7. As another example, when interleaving on a per segment basis over multiple segments (each segment including multiple contiguous slots), the UE may perform a separate interleaver process on the coded bits of each segment, as described in connection with FIG. 8.

In a fifth operation 925, the UE may transmit, and the base station may receive, the communication. For example, the communication may include an encoded transport block that is generated based at least in part on one or more interleaved encoded bit sequences (such as a plurality of interleaved encoded bit sequences. As noted above, in some aspects, the communication may be a PUSCH transmission that includes a single transport block, and the MST occasion may be an multi-slot PUSCH transmission occasion.

In a sixth operation 930, the base station may de-map the encoded codeblock to obtain soft information on the transmitted bits. For example, in some aspects, the base station may de-map the encoded codeblock to obtain the soft information, as described in more detail in connection with FIG. 3.

In a seventh operation 935, the base station may de-interleave the soft information to form de-interleaved soft information, on a per slot basis or per segment basis. In some aspects, the base station may de-interleave on a per segment basis for each of a plurality of segments, where each segment spans at least two slots and includes one of the one or more sets of contiguous time domain resources, as described in connection with FIG. 8.

In some aspects, when de-interleaving on the per slot basis, the base station may de-interleave a first subset of the soft information for a first slot of the MST occasion and de-interleave a second subset of the soft information for a second slot of the MST occasion. In such examples, the first slot and the second slot may be contiguous of one another. In some aspects, the MST occasion may consist of a single set of contiguous time domain resources that span the first slot and the second slot.

In some aspects, when de-interleaving on the per segment basis, the base station may de-interleave a first subset of the soft information for a first segment of the MST occasion and de-interleave a second subset of the soft information for a second segment of the MST occasion. In such examples, the first segment and the second segment may be associated with a single physical channel. In some aspects, the one or more sets of contiguous time domain resources for the MST occasion may include multiple sets of contiguous time domain resources, and each set of contiguous time domain resources may span two or more contiguous slots. In such examples, different sets of contiguous time domain resources may not be contiguous with one another, and each set of contiguous time domain resources is associated with a corresponding segment.

In some aspects, the codeblock may be one of multiple codeblocks of the communication. In such examples, the base station may de-interleave on the per slot basis or the per segment basis based at least in part on the codeblock spanning across two slots or two segments. For example, the base station may not de-interleave codeblocks on the per slot or per segment basis in a situation where a codeblock spans only a single slot.

In an eighth operation 940, the base station may concatenate the de-interleaved soft information to form concatenated soft information. In a ninth operation 945, the base station may decode the concatenated soft information to infer one or more codeblocks of the communication. For example, the base station may decode the transmitted bits based on the concatenated soft information that is presented as input to the decoder. The decoding block partitions the concatenated soft information to identify the soft information associated with each encoded codeblock. Each such partition is then used to decode the actual transmitted bits corresponded to that codeblock.

Figure 10:
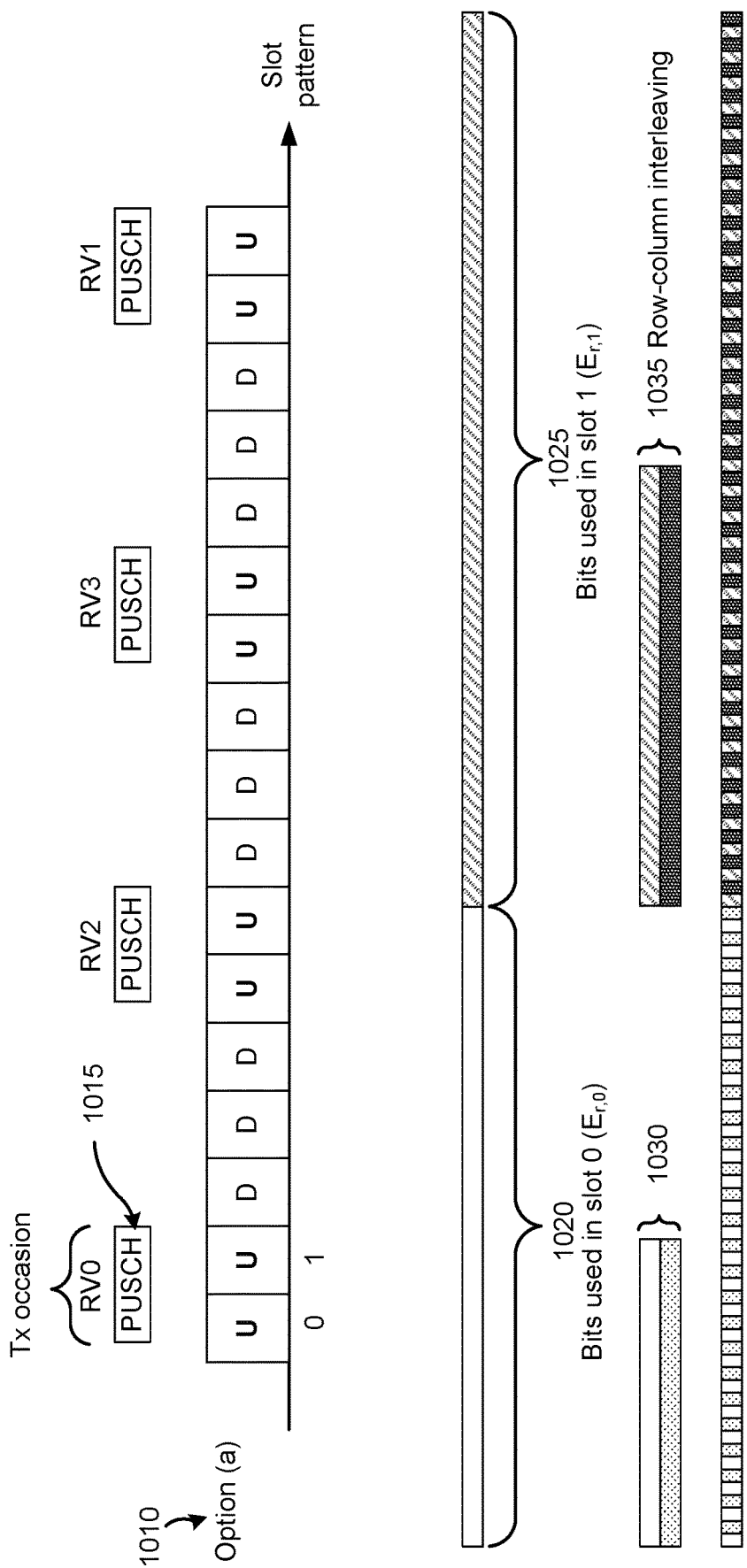
FIG. 10 is a diagram illustrating an example of a per slot interleaver design for multi-slot uplink shared channel transmission in accordance with the present disclosure.

FIG. 10 is a diagram illustrating an example of a per slot interleaver design for multi-slot uplink shared channel transmission in accordance with the present disclosure.

A UE may use the first type of multi-slot PUSCH transmission, Option (a) (indicated by 1010), to transmit encoded bits of a PUSCH that spans multiple slots, including slot 0 and slot 1. In this example, a first multi-slot PUSCH transmission occasion 1015 spans a set of two contiguous slots and includes bits that correspond to RV0. The UE may obtain respective sets of encoded bits 1020 and 1025 for the first multi-slot PUSCH transmission occasion 1015 from a circular buffer based at least in part on a starting position indicated by the RV index.

For per slot rate matching, the UE may perform rate matching across each slot of the first multi-slot PUSCH transmission occasion 1015. For example, G (described in connection with FIG. 3, above) may be defined as the actual number of transmission bits available per slot. $E_r$ may be defined as the number of coded bits of the rth codeblock to be transmitted in a given slot.

As shown, the UE may select a first set of encoded bits 1025 of the selected bits for transmission via a first slot (slot 0) of the multi-slot PUSCH transmission occasion and a second set of encoded bits 1030 of the selected bits for transmission via a second slot (slot 1) of the multi-slot PUSCH transmission occasion 1015.

The below algorithm is an example of how per slot rate matching may be performed. The below algorithm can be applied for each slot of a transmission occasion using option (a), as shown in FIGS. 7 and 10, or using option (b), as shown in FIG. 8.

Denoting by $E_{r,p}$ the rate matching output sequence length for the r-th coded block in slot p, where the value of $E_{r,p}$ is determined as follows:

---

Set j = 0
for r = 0 to C − 1
  if the r -th coded block is not scheduled for transmission as indicated by CBGTI according to Clause 5.1.7.2 for DL-SCH and 6.1.5.2 for UL-SCH in [6, TS 38.214]
    $E_{r,p} = 0$;
  else
    if j ≤ C' − mod($G_p$/($N_L \cdot Q_m$), C') − 1

$$E_{r,p} = N_L \cdot Q_m \cdot \left\lfloor \frac{G_p}{N_L \cdot Q_m \cdot C'} \right\rfloor;$$

else $$E_{r,p} = N_L \cdot Q_m \cdot \left\lceil \frac{G_p}{N_L \cdot Q_m \cdot C'} \right\rceil;$$

end if
    j = j+1;
  end if
end for

--- where $N_L$ is the number of transmission layers that the transport block is mapped onto;

$Q_m$ is the modulation order;

$G_p$ is the total number of coded bits available for transmission of the transport block in the $p^{th}$ slot of the transmission occasion;

C'=C if CBGTI is not present in the DCI scheduling the transport block and c is the number of scheduled code blocks of the transport block if CBGTI is present in the DCI scheduling the transport block.

Denote by $rv_{id}$ the redundancy version number for this transmission ($rv_{id}$=0, 1, 2 or 3), the rate matching output bit sequence $e_k$, k=0, 1, 2, ..., E−1, is generated as follows, where $k_{0,p}$ is given by Table 5.4.2.1-2 according to the value of $rv_{id}$ and LDPC base graph when p=1 and is otherwise computed as $k_{0,p} = W_{p-1} + k_{0,p-1}$ where $$W_{p-1} = \min_r E_{r,p-1} \text{ OR } W_{p-1} = \max_r E_{r,p-1}:$$

```
k = 0 ;
j = 0;
while k < E
    if d_(k_0,r,p+j) mod N_cb ≠< NULL >
        e_k = d_(k_0,r,p+j) mod N_cb;
        k = k + 1 ;
    end if
    j = j+1;
end while
```

In some aspects, rate matching output bit sequence $e_k$ may be determined as follows:

Denote by $rv_{id}$ the redundancy version number for this rate matching transmission ($rv_{id}$=0, 1, 2 or 3), the rate matching output bit sequence $e_k$, k=0, 1, 2, ..., E−1, for the $r^{th}$ codeblock of $p^{th}$ slot is generated as follows, where $k_{0,r,p}$ is given by Table 5.4.2.1-2 according to the value of $rv_{id}$ and LDPC base graph when p=1 and is otherwise computed as $k_{0,r,p} = E_{r,p-1} + k_{0,r,p-1}$:

```
k = 0 ;
j = 0;
while k < E
    if d_(k_0,r,p+j) mod N_cb ≠< NULL >
        e_k = d_(k_0,r,p+j) mod N_cb;
        k = k + 1 ;
    end if
    j = j+1;
end while
```

As shown, the UE may perform interleaving on set of encoded bits 1020 and 1025 to form two sequences of interleaved encoded bits 1030 and 1035 having data rearranged via one or more interleaving processes described herein. After interleaving, the UE may transmit the encoded bits via the multi-slot PUSCH transmission occasion. For example, the UE may concatenate the coded and interleaved bits to form a codeblock and may transmit the codeblock.

In some aspects, interleaving may be performed on a per slot basis (as in FIG. 10) and RV cycling may be performed on a per slot basis. In other aspects, interleaving may be performed on a per slot basis and RV cycling may be performed on a per transmission occasion basis. In yet other aspects, interleaving may be performed on a per slot basis and RV cycling may be performed on a per segment basis.

Particular aspects of the subject matter described in this disclosure can be implemented to realize one or more of the following potential advantages. In some examples, the described techniques can be used to improve the quality and performance of network transmissions, such as PUSCH or other transmissions that span multiple slots. When selecting bits and performing interleaving on a per slot basis, a UE may incur reduced overhead in that only a starting position within a circular buffer is stored for each slot, reducing the need to store additional information regarding the state of a transmission. In addition, there may be no need to buffer bits to be transmitted, as preserving the circular buffer suffices to referencing rate matched bits. Selecting bits and performing interleaving on a per slot basis also enables UCI multiplexing to be performed on a per slot basis. In this way, the use of codeblock interleaving for multi-slot uplink shared channel transmissions on a per slot basis may reduce the complexity of current UE interleaving processes and provides efficiency improvements for a UE, which may enable the UE to more efficiently consume power, communication, network, and computing resources.

In some aspects, RV bundling may be used. For example, when a PUSCH is configured with Type A repetition, RV cycling may be used. In RV cycling, RV indexes are refreshed for every slot or every repetition of a PUSCH. For a multi-slot uplink shared channel transmission, an RV index may be used across multiple slots. A group of multiple slots for which the same RV index is used may be referred to as "bundled" or "associated with RV bundling." As described herein, the multiple slots of a multi-slot uplink shared channel transmission may be divided into multiple RV bundles, with a different RV used across multiple slots in each RV bundle.

For an RV bundle, the same RV index may be used across multiple slots or repetitions. Thus, coded bits to be transmitted across the multiple slots may be chosen in a contiguous manner based at least in part on a single RV index, as described elsewhere herein. The number of slots across which a single RV index is used (i.e., the size of an RV bundle) is governed by an RV bundle size. The RV bundle size may be specified in terms of slots or repetitions, and may be counted based at least in part on slots including actual transmissions. Rate matching for RV bundling may be performed per slot. RV bundling may be indicated separately for dynamic grants (DGs) and configured grants (CGs).

If RV bundling is used, per slot rate matching may be performed, as mentioned above. For per slot rate matching to be successful, the UE and the base station should be synchronized with regard to start locations of rate matching in the circular buffer used to perform rate matching. However, there are situations where the UE and the base station may have different information regarding start locations in the circular buffer. For example, in some cases, uplink control information (UCI) may be multiplexed with a multi-slot uplink shared channel transmission on a slot. UCI multiplexing alters the number of rate matched bits transmitted in a slot. To maintain proper rate matching and decoding, the UE and the base station may need to be in sync on how resources are partitioned between the UCI and an uplink shared channel (UL-SCH) of the multi-slot uplink shared channel transmission. However, differences in understanding between the UE and the base station can arise, for example, in the case when the UE misses a sequence of downlink control information (DCI) transmissions and is thus unaware that UCI should be transmitted. Once a misunderstanding regarding circular buffer start location occurs, each subsequent slot of an RV bundle may be negatively impacted. For example, the start location of a second slot is generally immediately after a last bit that was read for a first slot. Thus, a misunderstanding can propagate through the second slot and each subsequent slot, causing failure to receive uplink communications and diminished throughput.

Some techniques and apparatuses described herein enable determination of starting locations in a circular buffer for RV bundled slots of a multi-slot uplink shared transmission. For example, the UE and/or the base station may determine the starting locations for a group of slots independently of each other. Put another way, the UE and/or the base station may decouple the process of determining start locations for each slot of a multi-slot uplink shared channel transmission. In some aspects, the UE and/or the base station may determine (e.g., precompute) the start locations prior to the start of transmission. In some aspects, the UE and/or the base station may not revise the start locations irrespective of whether UCI is multiplexed (e.g., in any slot of the RV bundled slots) or a cancellation occurs. Thus, throughput is improved and reliability of uplink communications is improved. Furthermore, a misunderstanding regarding a start location or end location of a bit selection operation is localized to a single slot rather than impacting all subsequent slots.

Some techniques and apparatuses described herein provide signaling mechanisms for indicating how RV bundling is to be performed. For example, RV bundling may be indicated in different cases such as when the TBoMS is scheduled with a dynamic grant (DG) or when the TBoMS is scheduled with a configured grant (CG). A PUSCH DG may be indicated, for example, via DCI. For example, a UE may receive a configuration of resources for a multi-slot uplink shared channel transmission, transmit coded bits of the TB with a first RV across a first bundle of slots, and transmit (other) coded bits of the TB with a second RV across a second bundle of slots.

Figure 12:
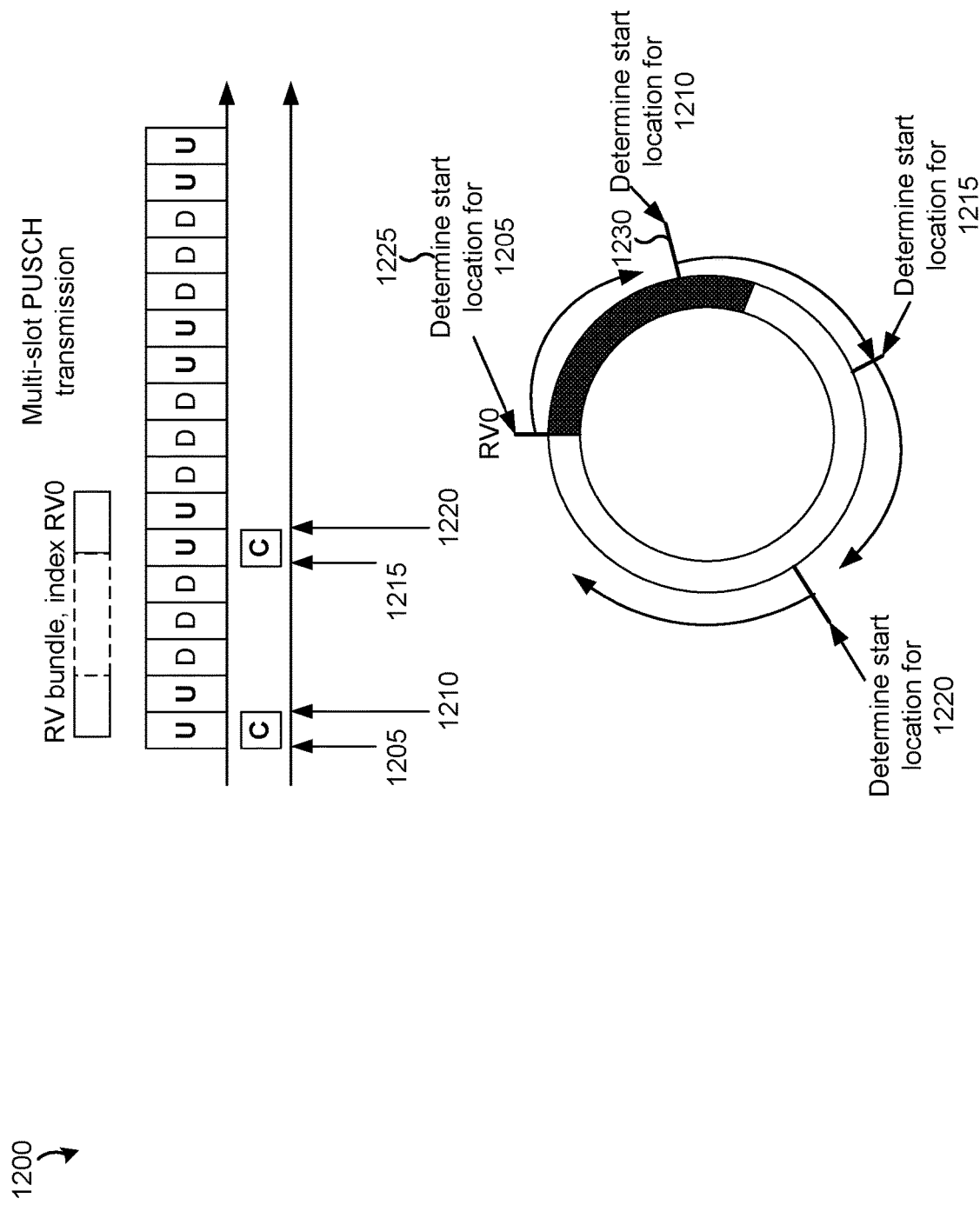
FIG. 12 is a diagram illustrating an example of bit selection using start locations that are independent of end locations of prior bit selection operations, in accordance with the present disclosure.

FIG. 12 is a diagram illustrating an example 1200 of bit selection using start locations that are independent of end locations of prior bit selection operations, in accordance with the present disclosure. In example 1200, a multi-slot PUSCH transmission is associated with an RV bundle having a starting index of RV0. The RV bundle includes four uplink slots, indicated by reference numbers 1205, 1210, 1215, and 1220. The "C" indicates that UCI is multiplexed with the multi-slot PUSCH transmission on the slots indicated by reference numbers 1205 and 1215. These techniques can also be applied for other forms of interruptions to the multi-slot PUSCH transmission, such as cancelled transmissions, preempted communications, and so on.

As shown by reference number 1225, a UE and/or a base station may determine a start location for the slot shown by reference number 1205. A start location for a slot is a first bit of the circular buffer that is read for the slot. Similarly, and as shown, the UE and/or the base station may determine start locations for the slots shown by reference numbers 1210, 1215, and 1220. In some aspects, the UE and/or the base station may determine the start locations prior to transmitting the multi-slot PUSCH transmission. In some aspects, the start location of a given slot may be independent of the end location of a prior slot. For example, in some cases, if a first slot's bits are read until bit N of the circular buffer, then a second slot's bits start at bit N+1. This may lead to diminished throughput and reliability if the UE and the base station have different understandings of the index of N. In the techniques and apparatuses described herein, the start location of the read operation for the slot indicated by reference number 1210 is decoupled from the end location of the read operation of the slot indicated by reference number 1205. The end location for a slot is the last bit of the circular buffer that is read for the slot. For example, the read operation for the slot may start at the start location and end at the end location. An end location may be considered adjacent to a start location if the bit of the end location is adjacent to the bit of the start location in the circular buffer. Thus, even though the slot indicated by reference number 1205 includes multiplexed UCI (which causes the read operation for the slot indicated by reference number 1205 to end before the determined start location for the slot indicated by reference number 1210), the read operation and subsequent decoding for the slot indicated by reference number 1210 starts at the location shown by reference number 1230. Thus, reliability is improved and the effect of a misunderstanding regarding the start location of the read operation for the second slot is minimized.

In some aspects, the UE and/or the base station may determine the start locations based at least in part on an offset. For example, the offset may be relative to a location of the buffer associated with the RV index of the RV bundle. In this case, the UE and/or the base station may determine the location of the buffer associated with the RV index as the start location of a first slot (e.g., the slot indicated by reference number 1205), and may apply the offset to identify start locations of the slots shown by reference numbers 1210, 1215, and 1220. For example, the UE and/or the base station may identify the start locations as follows:

Start location of slot shown by reference number 1205: startIndex_RV

Start location of slot shown by reference number 1210: startIndex_RV+offset1

Start location of slot shown by reference number 1215: startIndex_RV+offset2

Start location of slot shown by reference number 1220: startIndex_RV+offset3

In some aspects, the offset may be based at least in part on at least one of a number of REs in a given slot of the multi-slot PUSCH transmission, a modulation order associated with the multi-slot PUSCH transmission, a number of layers of the multi-slot PUSCH transmission, or the like. For example, for the single-codeblock case, the UE and/or the base station may determine the offset for slot K as:

offsetK=N_RE_in_slot_K*mod_order*num_layers, wherein the offset for slot K is offsetK, N_RE_in_slot_K represents the nominal number of resource elements (REs) available in slot K, mod_order represents the modulation order in slot K, and num_layers represents the number of layers in slot K. The determination of N_RE_in_slot_K is described in more detail below. Techniques for determining the offset for slot K in the multi-codeblock case are described below.

In some aspects, the UE and/or the base station may determine the offset based at least in part on a scaling factor. The scaling factor may account for overhead associated with the multi-slot PUSCH transmission. For example, the scaling factor may enable the UE and/or the base station to compensate for the multiplexing of UCI with the multi-slot PUSCH transmission by decreasing the number of bits used for each slot. In this case, the UE and/or the base station may determine offsetK as: offsetK=N_RE_in_slot_K*mod_order*num_layers*scaling factor. In some aspects, when using the scaling factor, certain bits may be transmitted twice. For example, an overlap may occur if a scaling factor less than 1 is used and no UCI is multiplexed on a given slot.

In some aspects, the UE and/or the BS may determine a number of REs ($N_{RE}'$) allocated for a PUSCH within a physical resource block (PRB) as $N_{RE}'=N_{SC}^{RB}*N_{symb}^{sh}-N_{DMRS}^{PRB}-N_{OH}^{PRB}$, where $N_{SC}^{RB}$ is the number of resource blocks allocated to the PUSCH, $N_{symb}^{sh}$ is the number of symbols allocated to the PUSCH, $N_{DMRS}^{PRB}$ is a number of resources allocated for demodulation reference signals (DMRSs), and $N_{OH}^{PRB}$ is an additional overhead factor. The UE and/or the base station may then determine a nominal number of REs allocated to PUSCH (N_RE_in_Slot_K): N_RE_in_Slot_K=$n_{prb}$*min(156, $N_E$), where $n_{prb}$ denotes the total number of PRBs assigned to the UE. The UE and/or the base station may then determine an intermediate number of information bits $N_{coded\ bits}$: $N_{coded\ bits}=N_{RE}*Q_m*v$, $Q_m$ is the modulation order and v is the number of layers. The UE and/or the base station may determine a total number of coded bits per slot, and then may divide the total number of coded bits per slot across the codeblocks. For example, let N_bits_in_slot_K=N_RE_in_slot_K*mod_order*num_layers, wherein N_RE_in_slot_K: nominal number of REs available for PUSCH per slot. If a scaling factor is used, then N_bits_in_slot_K=N_RE_in_slot_K*mod_order*num_layers*alpha, where alpha<1.

In some aspects, the UE and/or the base station may perform such a determination for multiple codeblocks. In this case, N_bits_in_slot_K may be divided across the multiple codeblocks as shown by one of the following formulas:

$$offsetK_R = v_L \cdot Q_m \cdot \left\lfloor \frac{\text{N\_bits\_in\_slot\_k}}{v_L \cdot Q_m \cdot C'} \right\rfloor,$$

$$\text{or } offsetK_R = v_L \cdot Q_m \cdot \left\lceil \frac{\text{N\_bits\_in\_slot\_k}}{v_L \cdot Q_m \cdot C'} \right\rceil,$$

where C' is the number of codeblocks to be transmitted.

In some aspects, the UE may receive signaling indicating a value of a scaling factor. For example, the UE may receive radio resource control (RRC) signaling indicating a value of the scaling factor. As another example, the UE may receive signaling indicating multiple scaling factors, and a grant associated with the multi-slot PUSCH transmission may indicate a selected scaling factor. In some aspects, the UE may receive signaling (such as configuration signaling) indicating an overhead parameter $N_{OH,TBoMS}^{PRB}$, which may be used in the formula for $N_{RE}'$.

Figure 13:
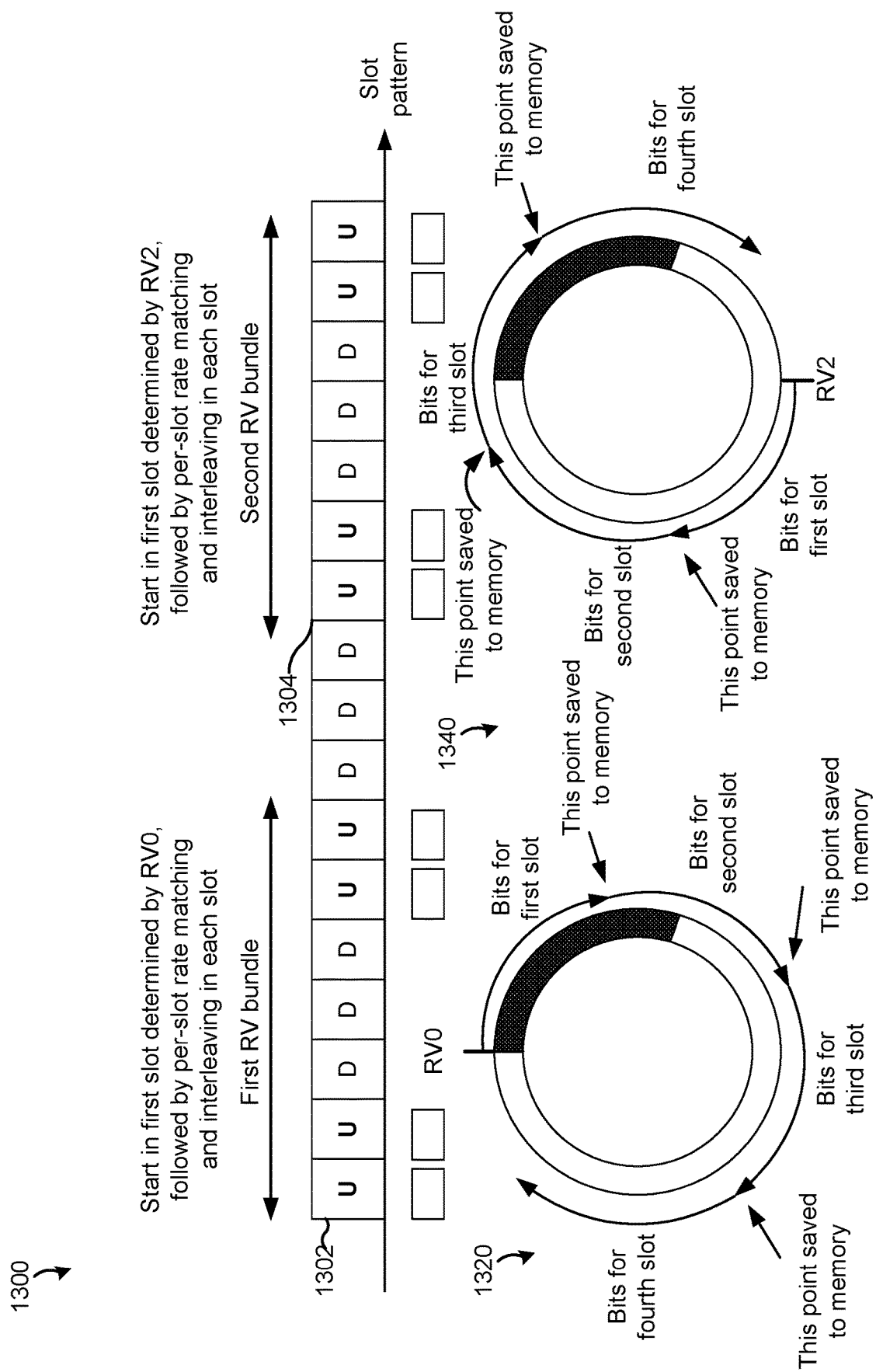
FIG. 13 is a diagram illustrating an example of redundancy version (RV) bundling for a multi-slot physical uplink shared channel (PUSCH) transmission in accordance with the present disclosure.

FIG. 13 is a diagram illustrating an example of RV bundling for a multi-slot PUSCH transmission, such as a TBoMS transmission, in accordance with the present disclosure. The example assumes a TBoMS transmission across 8 slots (labeled as U) and also assumes a bundling size of 4 slots.

As shown, a first RV (RV0) may be used in a first RV bundle (4 slots starting with a first uplink slot 1302). In some cases, per-slot rate matching and interleaving may be performed in each slot across the first RV bundle. Similarly, a second RV (RV2) may be used in a second RV bundle (4 slots starting with a first uplink slot 1304).

As illustrated, a UE may identify and read bits, from a circular buffer 1320 with systematic bits and parity bits according to RV0, to transmit in the first slot of the first RV bundle. In some cases, the UE may save (e.g., to memory) a first point corresponding to the end of the number of bits that the UE was able to transmit in the first slot. This allows the UE to then start from this point to read bits for transmission in a second slot of the first RV bundle. As illustrated, this process may continue for each of the four slots if the first RV bundle.

For the second RV bundle, the UE may follow a similar process. For example, the UE may identify and read bits, from a circular buffer 1340 with systematic bits and parity bits according to RV2, to transmit in the first slot of the second RV bundle. As shown, the UE may save a first point corresponding to the end of the number of bits that the UE was able to transmit in the first slot of the second RV bundle. As illustrated, this process may continue for each of the four slots if the second RV bundle.

As noted, aspects of the present disclosure provide various mechanisms for indicating how RV bundling is to be performed when a UE is scheduled for a TBoMS transmission.

As indicated above, FIG. 13 is provided as an example. Other examples may differ from what is described with regard to FIG. 13.

Figure 14:
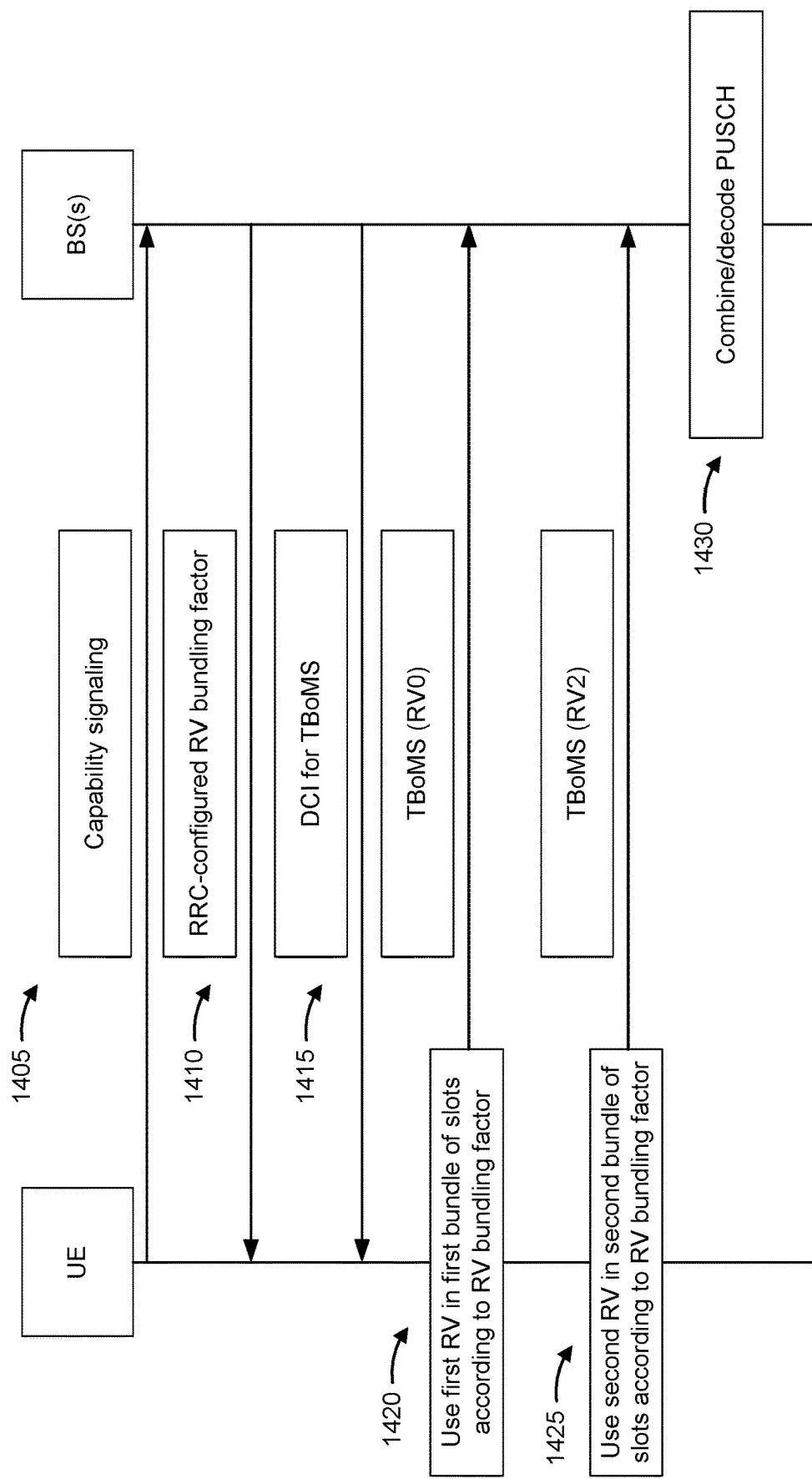
FIG. 14 is a diagram illustrating an example of RV bundling performed by a UE for a multi-slot PUSCH transmission scheduled with a dynamic grant (DG) from a network node, in accordance with the present disclosure.

FIG. 14 is a diagram illustrating an example of RV bundling performed by a UE for a TBoMS (that is, a multi-slot physical uplink shared channel (PUSCH) transmission) scheduled with a dynamic grant (DG) from a network node (e.g., base station 110, a central unit, a distributed unit, or a radio unit), in accordance with the present disclosure.

As shown by reference number 1405, the UE may provide an indication of a UE capability with regard to RV bundling. For example, the UE capability may indicate that the UE has a capability for RV bundling across consecutive slots. As another example, the capability may indicate that the UE has a capability for RV bundling across non-consecutive slots. As another example, the UE capability may indicate that the UE does not have a capability for RV bundling. As another example, the UE capability may indicate an RV bundling size supported by the UE.

In some cases, the network node may determine how to configure the UE for RV bundling based at least in part on the indication. For example, the RV bundling may be based at least in part on the (signaled) capability of the UE, such as whether the UE supports RV bundling, a bundling size supported by the UE, or whether the UE supports bundling across non-consecutive slots.

As shown by reference number 1410, the network node may configure the UE for RV bundling via RRC signaling of an RV bundling factor. In some aspects, a central unit (CU) may configure the UE for RV bundling via RRC signaling.

As shown by reference number 1415, the network node may subsequently schedule the UE with a TBoMS transmission via a DCI. In some aspects, a distributed unit or a radio unit may transmit the DCI. In some cases, the DCI may indicate a parameter in the DCI for performing RV bundling in the TBoMS. For example, the DCI may indicate an RV bundling factor (e.g., rather than providing the RV bundling factor via RRC signaling), or may indicate that the UE should perform RV bundling in the TBoMS according to the RRC configured RV bundling factor of reference number 1410.

As shown by reference number 1420, the UE may transmit a first number of PUSCH repetitions (e.g., based at least in part on the RV bundling size) in a first RV bundle using a first RV (e.g., RV0). As shown by reference number 1425, the UE may then transmit a second number of PUSCH repetitions in a second RV bundle using a second RV (e.g., RV2).

In some cases, the DCI may include a dedicated flag for TBoMS. For example, this flag may be set to indicate the UE is to use the RRC configured bundling value. In some cases, the RV bundling value may depend on a number of repetitions for the TBoMS scheduled by the DCI. For example, the number of repetitions may define the RV bundling factor (e.g., the RV bundling factor may be equal to the number of repetitions).

As shown by reference number 1430, the network node may decode and/or combine the PDSCH. For example, the network node may perform one or more operations described with regard to reference numbers 930, 935, 940, and/or 945 of FIG. 9.

FIG. 15 is a diagram illustrating an example of an RV table, in accordance with the present disclosure. In some examples, an RV bundling repetition table (e.g., an RV table) may be specified, such as in a wireless communication specification. For example, if the TBoMS flag described with regard to FIG. 14 is set in the DCI described with regard to FIG. 14, the UE may perform RV bundling according to the RV table. The RV table may be considered a new RV table, relative to existing RV tables that indicate RV sequences that indicate which RV a UE is to apply for a given transmission occasion (e.g., for Type A repetition) or an actual repetition (e.g., for Type B repetition).

As illustrated in FIG. 15, the RV table may indicate a sequence of RVs for the UE to use in different RV bundles, such as different groups of multiple slots associated with one or more multi-slot transmission occasions. For example, the DCI may indicate an RV index, $rv_{id}$, that the UE uses as an index into the table, to determine a particular RV sequence (e.g., which may indicate which RV the UE is to use in which RV bundle). In the illustrated example, assuming an $rv_{id}$ of 0, the RV table indicates that the UE should use RV0 in the first RV bundle and RV2 in the second RV bundle (similar to the example shown in FIG. 13). Assuming four RV bundles (e.g., if the number of repetitions was 16 and the bundling size were 4), the UE would apply RV3 in the third RV bundle and RV1 in the fourth RV bundle.

In some cases, such an RV table may also specify the RV bundling size and/or other parameters. In some cases, the use of such an RV table may be conditioned on the number of repetitions for a TBoMS (e.g., repetition specific RV sequences may be defined). In some cases, if the TBoMS flag is not set in the DCI, the UE may use a conventional (legacy) RV cycling table with RV sequences that indicates which RV a UE is to apply for a given transmission occasion or actual repetition.

In some cases, if no dedicated flag is provided in a DCI for TBoMS, TBoMS may be indicated implicitly in the DCI, and the UE may perform RV bundling based at least in part on this implicit indication. The implicit indication may be based at least in part on a time domain resource allocation (TDRA) and/or a frequency domain resource allocation (FDRA) (e.g., if the TDRA and/or the FDRA indicate certain resources, TBoMS may be assumed). For example, the implicit indication may be based on TDRA tables conditioned on FDRA.

Figure 16:
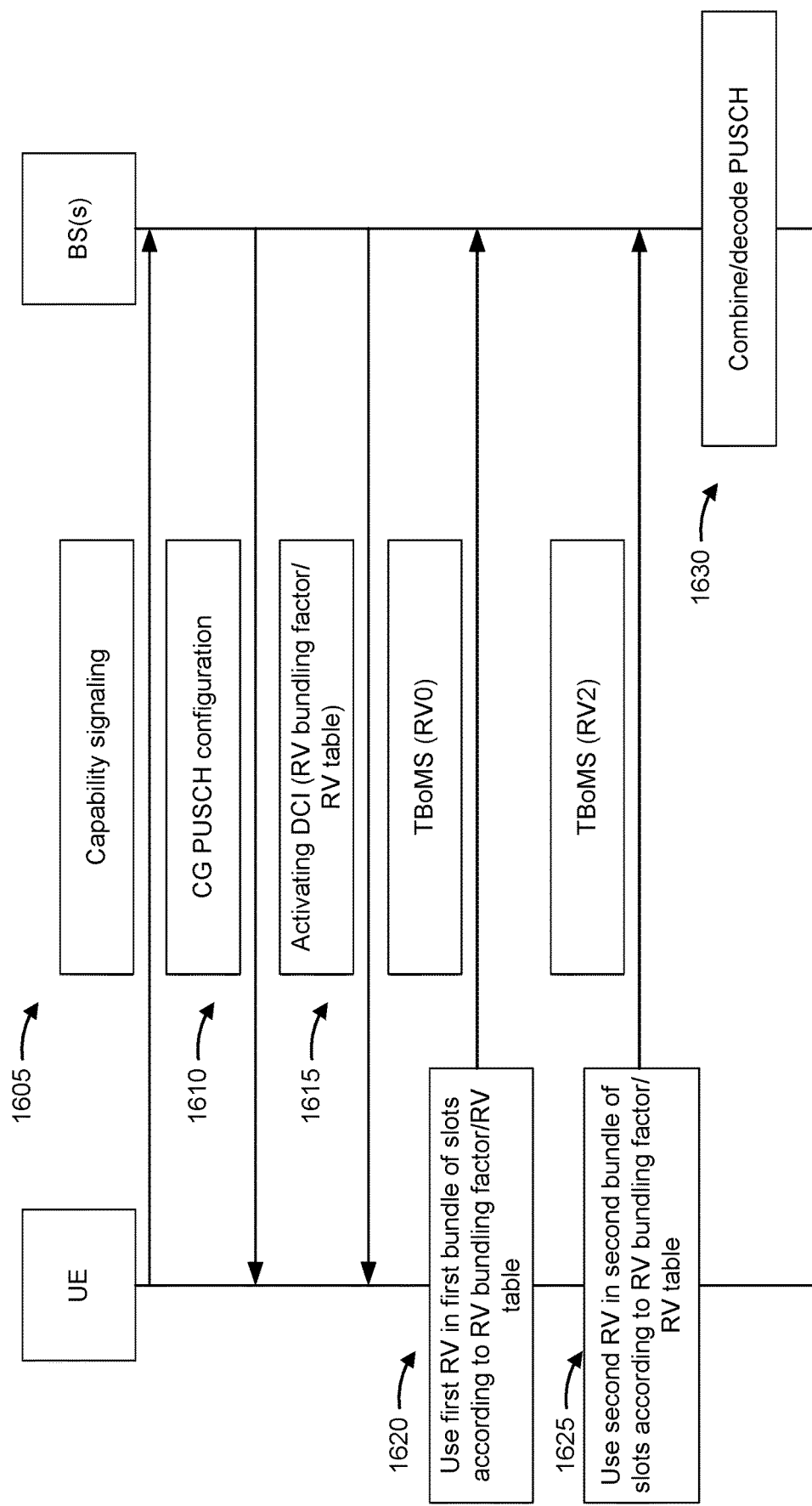
FIG. 16 is a diagram illustrating an example of RV bundling performed by a UE for a multi-slot PUSCH transmission scheduled with a configured grant (CG), in accordance with the present disclosure.

FIG. 16 is a diagram illustrating an example of RV bundling performed by a UE for a TBoMS (that is, a multi-slot PUSCH transmission) scheduled with a configured grant (CG), in accordance with the present disclosure. The example includes a UE (e.g., UE 120) and a network node (e.g., base station 110, a CU, a DU, an RU, or a combination thereof).

As shown by reference number 1605, the UE may provide an indication of a UE capability with regard to RV bundling. For example, the UE capability may indicate that the UE has a capability for RV bundling across consecutive slots. As another example, the capability may indicate that the UE has a capability for RV bundling across non-consecutive slots. As another example, the UE capability may indicate that the UE does not have a capability for RV bundling. As another example, the UE capability may indicate an RV bundling size supported by the UE.

In some cases, the network node may determine how to configure the UE for RV bundling based at least in part on the indication. For example, the RV bundling may be based at least in part on the (signaled) capability of the UE, such as whether the UE supports RV bundling, a bundling size supported by the UE, or whether the UE supports bundling across non-consecutive slots.

As shown by reference number 1610, the UE may be configured with a CG PUSCH configuration, for example, indicating CG resources to be used for a TBoMS. For example, the network node (e.g., a CU) may transmit an RRC configuration indicating the CG PUSCH configuration.

In some aspects, a flag (e.g., a dedicated TBoMS flag) may be included in the CG configuration. As in the DG grant example described above with regard to FIG. 14, if this flag is set, the UE may use a configured RV bundling size.

As shown by reference number 1615, the CG associated with the TBoMS (e.g., configured as shown by reference number 1610) may be activated via a DCI (which, in some examples, indicates an RV bundling factor or an RV table), for example, for Type 2 CG where an uplink grant is provided using a physical downlink control channel (PDCCH). For example, the network node (e.g., a DU and/or an RU) may transmit the DCI. As shown by reference number 1620, the UE may transmit a first number of PUSCH repetitions in a first RV bundle using a first RV. As shown by reference number 1625, the UE may transmit a second number of PUSCH repetitions in a second RV bundle using a second RV.

As noted above with regard to FIG. 14, the RV bundling size may be based at least in part on a number of repetitions. In some aspects, if the TBoMS flag is set, an RV table (such as the RV table shown in FIG. 15) may be used to determine RV indexes for the TBoMS. In some aspects, the RV table may also indicate the RV bundling factor.

As noted above with regard to FIG. 14, in some aspects, a new RV table may conditioned on the number of repetitions. If a flag is not set in the DCI, the UE may use a legacy RV cycling table. In some aspects, dedicated TDRA tables may be conditioned on FDRA (e.g., if the TDRA and/or the FDRA indicate certain resources, TBoMS may be assumed). These tables, or the use of the tables, may specify an RV bundling size.

As illustrated in FIG. 16, in some cases, the RV bundling factor may be signaled as part of the activating DCI (e.g., for a Type 2 CG). As an alternative, or in addition, the RV table may be signaled as part of the activating DCI.

As shown by reference number 1630, the network node may decode and/or combine the PDSCH. For example, the network node may perform one or more operations described with regard to reference numbers 930, 935, 940, and/or 945 of FIG. 9.

As indicated above, FIG. 16 is provided as an example. Other examples may differ from what is described with regard to FIG. 16.

Figure 17:
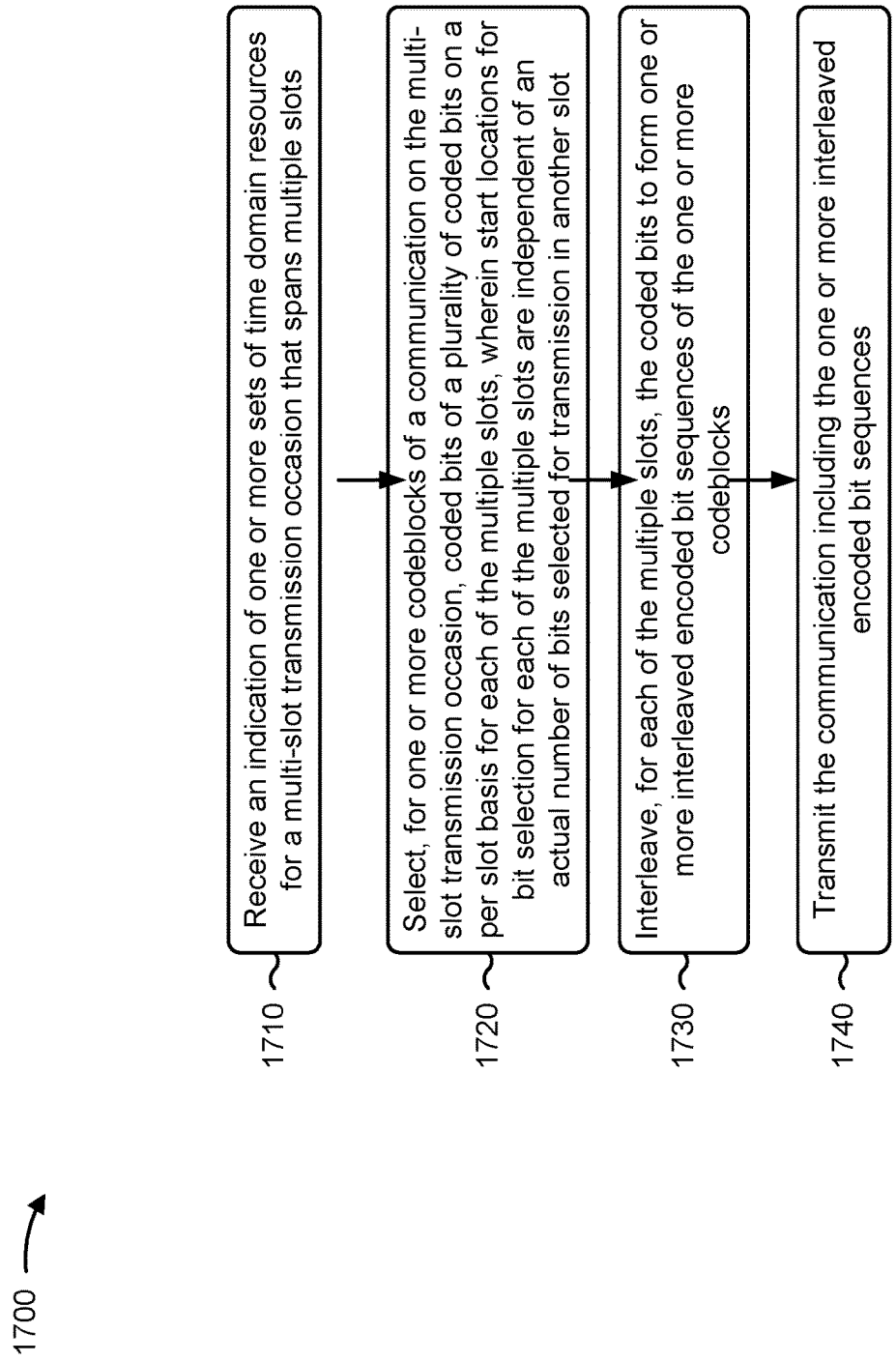
FIG. 17 is a flowchart illustrating an example process for multi-slot uplink shared channel transmission performed, for example, by a UE in accordance with the present disclosure.

FIG. 17 is a diagram illustrating an example process 1700 performed, for example, by a UE, in accordance with the present disclosure. Example process 1700 is an example where the UE (e.g., UE 120) performs operations associated with rate matching for multi-slot uplink transmissions.

As shown in FIG. 17, in some aspects, process 1700 may include receiving an indication of one or more sets of time domain resources for a multi-slot transmission occasion that spans multiple slots (block 1710). For example, the UE (e.g., using reception component 1902, depicted in FIG. 19) may receive an indication of one or more sets of time domain resources for a multi-slot transmission occasion that spans multiple slots, as described above.

As further shown in FIG. 17, in some aspects, process 1700 may include selecting, for one or more codeblocks of a communication on the multi-slot transmission occasion, coded bits of a plurality of coded bits on a per slot basis for each of the multiple slots, wherein start locations for bit selection for each of the multiple slots are independent of an actual number of bits selected for transmission in another slot (block 1720). For example, the UE (e.g., using selection component 1908, depicted in FIG. 19) may select, for one or more codeblocks of a communication on the multi-slot transmission occasion, coded bits of a plurality of coded bits on a per slot basis for each of the multiple slots. Start locations for bit selection for each of the multiple slots may be independent of an actual number of bits selected for transmission in another slot, as described above. For example, the start location for bit selection for a given slot may be the same, irrespective of an end location for bit selection for a slot prior to the given slot.

As further shown in FIG. 17, in some aspects, process 1700 may include interleaving, for each of the multiple slots, the coded bits to form one or more interleaved encoded bit sequences of the one or more codeblocks (block 1730). For example, the UE (e.g., interleaving component 1910, depicted in FIG. 19) may interleave, for each of the multiple slots, the coded bits to form one or more interleaved encoded bit sequences of the one or more codeblocks, as described above.

As further shown in FIG. 17, in some aspects, process 1700 may include transmitting the communication including the one or more interleaved encoded bit sequences (block 1740). For example, the UE (e.g., using transmission component 1904, depicted in FIG. 19) may transmit the communication including the one or more interleaved encoded bit sequences, as described above.

Process 1700 may include additional aspects, such as any single aspect or any combination of aspects described below and/or in connection with one or more other processes described elsewhere herein.

In a first aspect, selecting the coded bits on the per slot basis comprises selecting a first subset of the plurality of coded bits for a first slot of the multi-slot transmission occasion, and selecting a second subset of the plurality of coded bits for a second slot of the multi-slot transmission occasion, wherein the first slot and the second slot are contiguous.

In a second aspect, alone or in combination with the first aspect, the one or more sets of time domain resources for the multi-slot transmission occasion consist of a single set of time domain resources that span the first slot and the second slot, wherein the first slot and the second slot are contiguous with one another.

In a third aspect, alone or in combination with one or more of the first and second aspects, a start location of a given slot of the multiple slots is independent of a number of bits selected for a slot prior to the given slot.

In a fourth aspect, alone or in combination with one or more of the first through third aspects, a start location of a given slot of the multiple slots is different than an end location of a prior slot of the multiple slots.

In a fifth aspect, alone or in combination with one or more of the first through fourth aspects, process 1700 includes determining the start locations in accordance with an offset relative to a location of a circular buffer.

In a sixth aspect, alone or in combination with one or more of the first through fifth aspects, the multiple slots are associated with a redundancy version bundle corresponding to a redundancy version index indicating the location of the circular buffer.

In a seventh aspect, alone or in combination with one or more of the first through sixth aspects, the start locations are determined prior to selecting the coded bits.

In an eighth aspect, alone or in combination with one or more of the first through seventh aspects, process 1700 includes determining the offset based at least in part on at least one of a nominal number of resource elements available for the communication in a slot of the multiple slots, a modulation order of the communication, a number of layers of the communication, or a scaling factor.

In a ninth aspect, alone or in combination with one or more of the first through eighth aspects, the scaling factor reduces a length of the offset.

In a tenth aspect, alone or in combination with one or more of the first through ninth aspects, process 1700 includes receiving information indicating the scaling factor.

In an eleventh aspect, alone or in combination with one or more of the first through tenth aspects, determining the start locations is based at least in part on information received from a base station.

In a twelfth aspect, alone or in combination with one or more of the first through eleventh aspects, the communication is a physical uplink shared channel (PUSCH) transmission that includes a single transport block, and the multi-slot transmission occasion is a multi-slot PUSCH transmission occasion.

In a thirteenth aspect, alone or in combination with one or more of the first through twelfth aspects, process 1700 includes transmitting capability signaling indicating at least one of whether multi-slot transmission occasions are supported, whether per slot rate matching is supported, whether per segment rate matching is supported, or whether interleaving can be dynamically turned on or off.

Although FIG. 17 shows example blocks of process 1700, in some aspects, process 1700 may include additional blocks, fewer blocks, different blocks, or differently arranged blocks than those depicted in FIG. 17. Additionally, or alternatively, two or more of the blocks of process 1700 may be performed in parallel.

Figure 18:
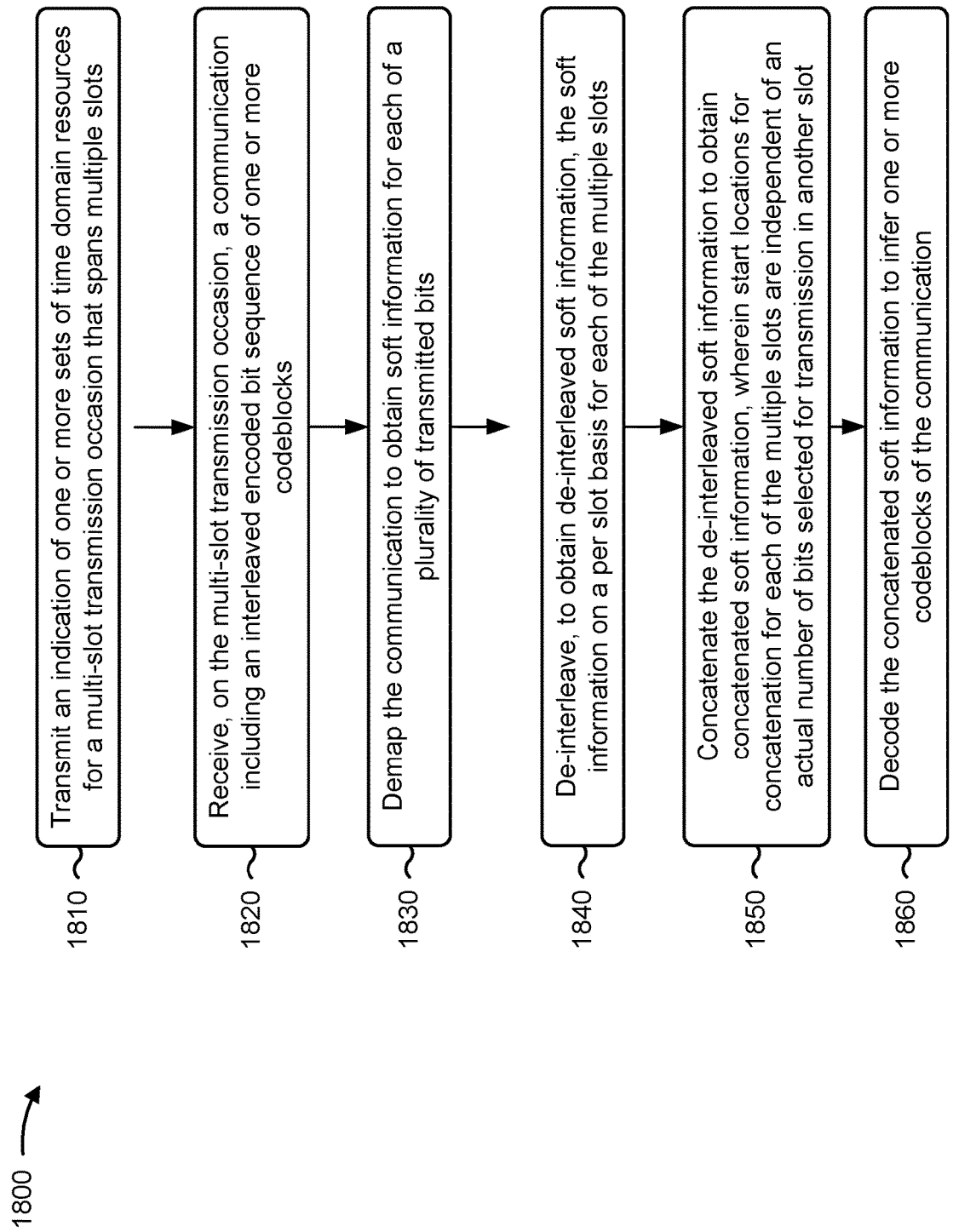
FIG. 18 is a flowchart illustrating an example process for multi-slot uplink shared channel transmission performed, for example, by a base station in accordance with the present disclosure.

FIG. 18 is a diagram illustrating an example process 1800 performed, for example, by a base station, in accordance with the present disclosure. Example process 1800 is an example where the base station (e.g., base station 110) performs operations associated with rate matching for multi-slot uplink transmissions.

As shown in FIG. 18, in some aspects, process 1800 may include transmitting an indication of one or more sets of time domain resources for a multi-slot transmission occasion that spans multiple slots (block 1810). For example, the base station (e.g., using transmission component 2004, depicted in FIG. 20) may transmit an indication of one or more sets of time domain resources for a multi-slot transmission occasion that spans multiple slots, as described above.

As further shown in FIG. 18, in some aspects, process 1800 may include receiving, on the multi-slot transmission occasion, a communication including an interleaved encoded bit sequence of one or more codeblocks (block 1820). For example, the base station (e.g., using reception component 2002, depicted in FIG. 20) may receive, on the multi-slot transmission occasion, a communication including an interleaved encoded bit sequence of one or more codeblocks, as described above.

As further shown in FIG. 18, in some aspects, process 1800 may include demapping the communication to obtain soft information for each of a plurality of transmitted bits (block 1830). For example, the base station (e.g., using demapping component 2008, depicted in FIG. 20) may demap the communication to obtain soft information for each of a plurality of transmitted bits, as described above.

As further shown in FIG. 18, in some aspects, process 1800 may include de-interleaving, to obtain de-interleaved soft information, the soft information on a per slot basis for each of the multiple slots (block 1840). For example, the base station (e.g., using de-interleaving component 2010, depicted in FIG. 20) may de-interleave, to obtain de-interleaved soft information, the soft information on a per slot basis for each of the multiple slots, wherein start locations for bit selection for each of the multiple slots are determined independently from one another, as described above.

As further shown in FIG. 18, in some aspects, process 1800 may include concatenating the de-interleaved soft information to obtain concatenated soft information, wherein start locations for concatenation for each of the multiple slots are independent of an actual number of bits selected for transmission in another slot (block 1850). For example, the base station (e.g., using concatenation component 2012, depicted in FIG. 20) may concatenate the de-interleaved soft information to obtain concatenated soft information, as described above.

As further shown in FIG. 18, in some aspects, process 1800 may include decoding the concatenated soft information to infer the one or more codeblocks of the communication (block 1860). For example, the base station (e.g., using decoding component 2014, depicted in FIG. 20) may decode the concatenated soft information to infer the one or more codeblocks of the communication, as described above.

Process 1800 may include additional aspects, such as any single aspect or any combination of aspects described below and/or in connection with one or more other processes described elsewhere herein.

In a first aspect, a start location of a given slot of the multiple slots is independent of a number of bits selected for a slot prior to the given slot.

In a second aspect, alone or in combination with the first aspect, a start location of a given slot of the multiple slots is different than an end location of a prior slot of the multiple slots.

In a third aspect, alone or in combination with one or more of the first and second aspects, process 1800 includes determining the start locations in accordance with an offset relative to a location of a circular buffer.

In a fourth aspect, alone or in combination with one or more of the first through third aspects, the multiple slots are associated with a redundancy version bundle corresponding to a redundancy version index indicating the location of the circular buffer.

In a fifth aspect, alone or in combination with one or more of the first through fourth aspects, process 1800 includes determining the offset based at least in part on at least one of a nominal number of resource elements available for the communication in a slot of the multiple slots, a modulation order of the communication, a number of layers of the communication, or a scaling factor.

In a sixth aspect, alone or in combination with one or more of the first through fifth aspects, the scaling factor reduces a length of the offset.

In a seventh aspect, alone or in combination with one or more of the first through sixth aspects, process 1800 includes transmitting information indicating the scaling factor.

In an eighth aspect, alone or in combination with one or more of the first through seventh aspects, the communication is a physical uplink shared channel (PUSCH) transmission that includes a single transport block, and the multi-slot transmission occasion is a multi-slot PUSCH transmission occasion.

Although FIG. 18 shows example blocks of process 1800, in some aspects, process 1800 may include additional blocks, fewer blocks, different blocks, or differently arranged blocks than those depicted in FIG. 18. Additionally, or alternatively, two or more of the blocks of process 1800 may be performed in parallel.

Figure 19:
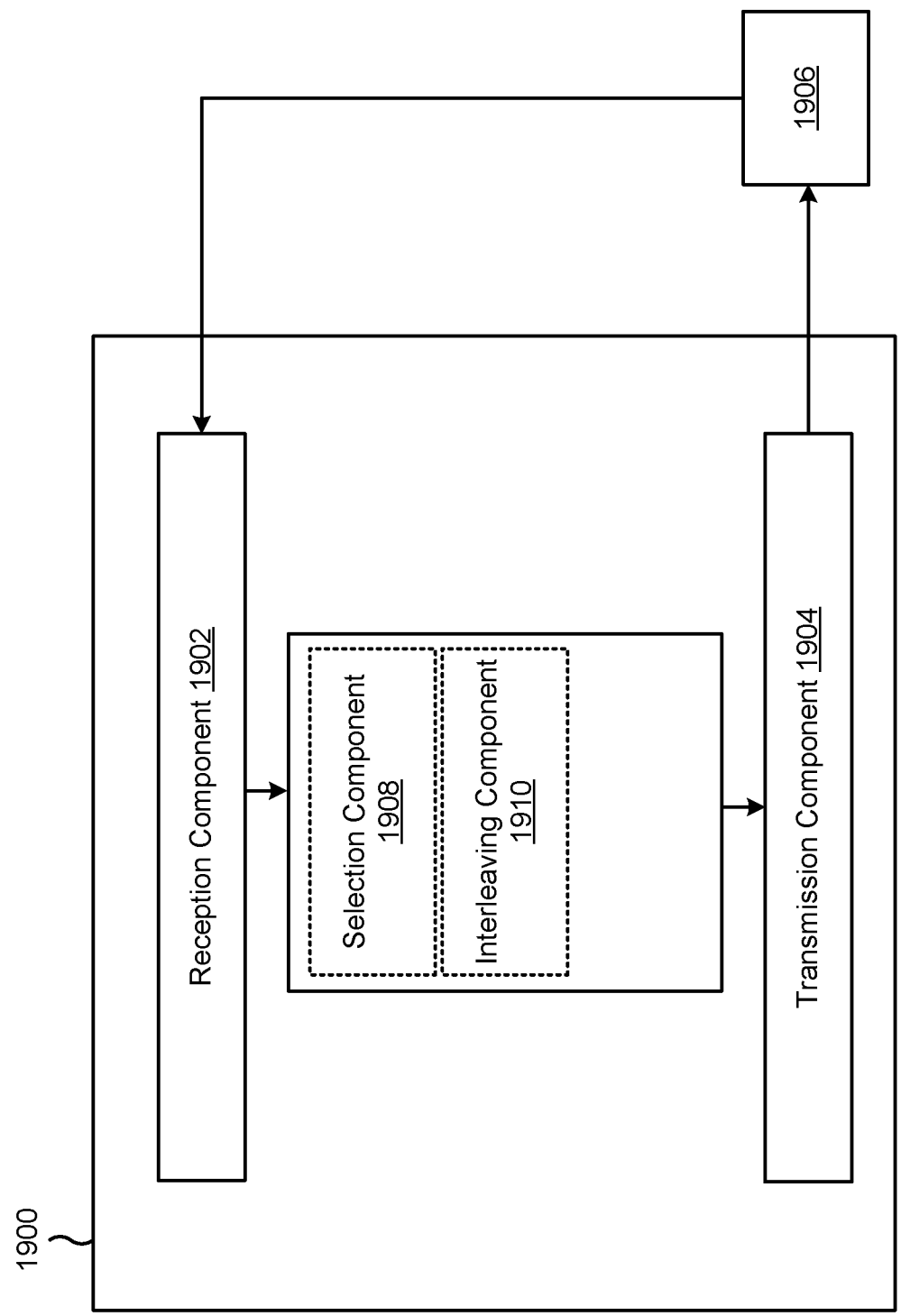
FIGS. 19 and 20 are block diagrams of example apparatuses for wireless communication in accordance with the present disclosure.

FIG. 19 is a block diagram of an example apparatus 1900 for wireless communication, in accordance with the present disclosure. The apparatus 1900 may be a UE, or a UE may include the apparatus 1900. In some aspects, the apparatus 1900 includes a reception component 1902 and a transmission component 1904, which may be in communication with one another (for example, via one or more buses and/or one or more other components). As shown, the apparatus 1900 may communicate with another apparatus 1906 (such as a UE, a base station, or another wireless communication device) using the reception component 1902 and the transmission component 1904. As further shown, the apparatus 1900 may include one or more of a selection component 1908, or an interleaving component 1910, among other examples.

In some aspects, the apparatus 1900 may be configured to perform one or more operations described herein in connection with FIGS. 3-12. Additionally, or alternatively, the apparatus 1900 may be configured to perform one or more processes described herein, such as process 1300 of FIG. 13, or a combination thereof. In some aspects, the apparatus 1900 and/or one or more components shown in FIG. 19 may include one or more components of the UE described in connection with FIG. 2. Additionally, or alternatively, one or more components shown in FIG. 19 may be implemented within one or more components described in connection with FIG. 2. Additionally, or alternatively, one or more components of the set of components may be implemented at least in part as software stored in a memory. For example, a component (or a portion of a component) may be implemented as instructions or code stored in a non-transitory computer-readable medium and executable by a controller or a processor to perform the functions or operations of the component.

The reception component 1902 may receive communications, such as reference signals, control information, data communications, or a combination thereof, from the apparatus 1906. The reception component 1902 may provide received communications to one or more other components of the apparatus 1900. In some aspects, the reception component 1902 may perform signal processing on the received communications (such as filtering, amplification, demodulation, analog-to-digital conversion, demultiplexing, deinterleaving, de-mapping, equalization, interference cancellation, or decoding, among other examples), and may provide the processed signals to the one or more other components of the apparatus 1900. In some aspects, the reception component 1902 may include one or more antennas, a demodulator, a MIMO detector, a receive processor, a controller/processor, a memory, or a combination thereof, of the UE described in connection with FIG. 2.

The transmission component 1904 may transmit communications, such as reference signals, control information, data communications, or a combination thereof, to the apparatus 1906. In some aspects, one or more other components of the apparatus 1900 may generate communications and may provide the generated communications to the transmission component 1904 for transmission to the apparatus 1906. In some aspects, the transmission component 1904 may perform signal processing on the generated communications (such as filtering, amplification, modulation, digital-to-analog conversion, multiplexing, interleaving, mapping, or encoding, among other examples), and may transmit the processed signals to the apparatus 1906. In some aspects, the transmission component 1904 may include one or more antennas, a modulator, a transmit MIMO processor, a transmit processor, a controller/processor, a memory, or a combination thereof, of the UE described in connection with FIG. 2. In some aspects, the transmission component 1904 may be co-located with the reception component 1902 in a transceiver.

The reception component 1902 may receive an indication of one or more sets of time domain resources for a multi-slot transmission occasion that spans multiple slots. The selection component 1908 may select, for one or more codeblocks of a communication on the multi-slot transmission occasion, coded bits of a plurality of coded bits on a per slot basis for each of the multiple slots, wherein start locations for bit selection for each of the multiple slots are determined independently from one another. The interleaving component 1910 may interleave the coded bits to form one or more interleaved encoded bit sequences of the one or more codeblocks. The transmission component 1904 may transmit the communication including the one or more interleaved encoded bit sequences.

The number and arrangement of components shown in FIG. 19 are provided as an example. In practice, there may be additional components, fewer components, different components, or differently arranged components than those shown in FIG. 19. Furthermore, two or more components shown in FIG. 19 may be implemented within a single component, or a single component shown in FIG. 19 may be implemented as multiple, distributed components. Additionally, or alternatively, a set of (one or more) components shown in FIG. 19 may perform one or more functions described as being performed by another set of components shown in FIG. 19.

Figure 20:
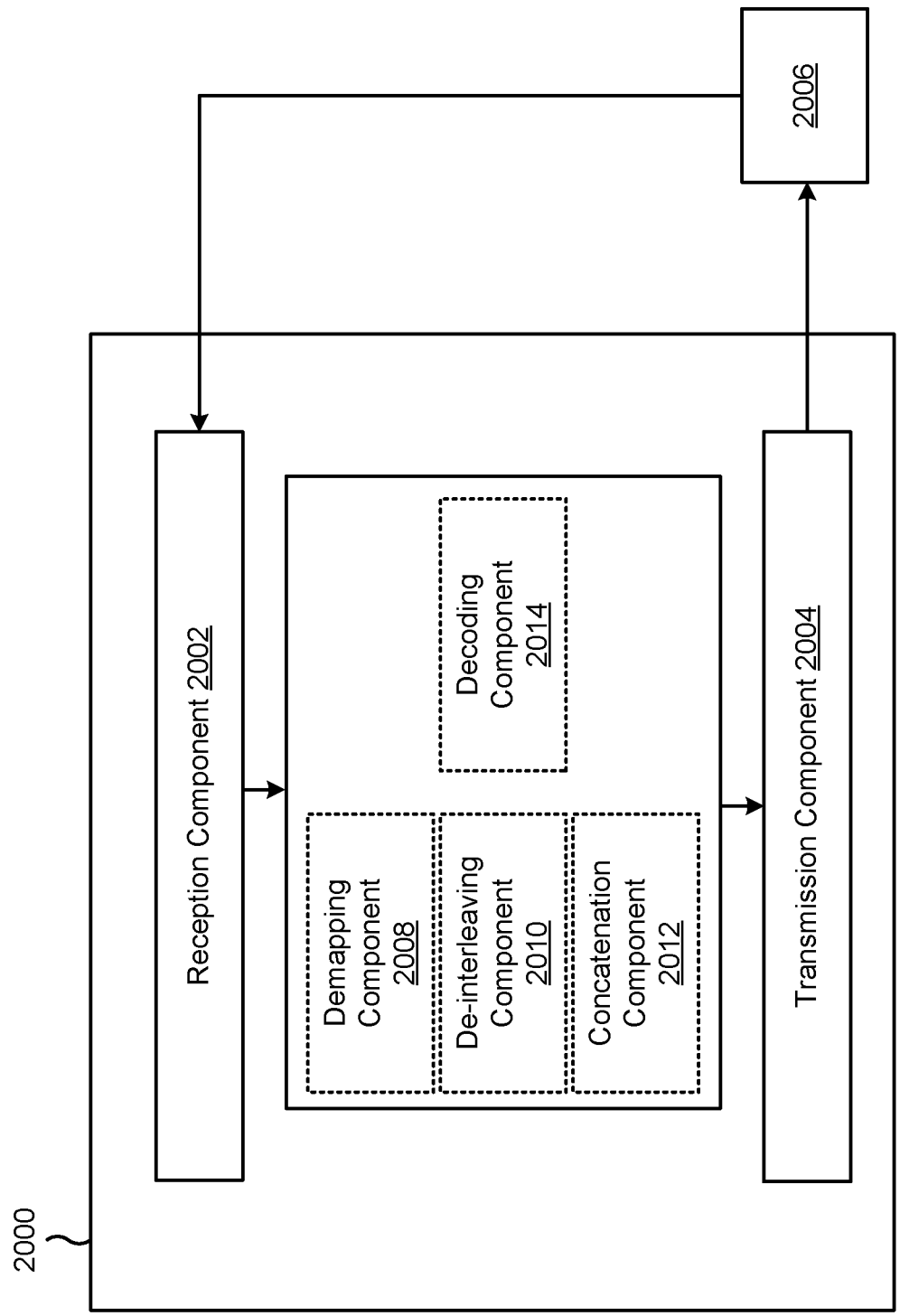

FIG. 20 is a block diagram of an example apparatus 2000 for wireless communication, in accordance with the present disclosure. The apparatus 2000 may be a base station, or a base station may include the apparatus 2000. In some aspects, the apparatus 2000 includes a reception component 2002 and a transmission component 2004, which may be in communication with one another (for example, via one or more buses and/or one or more other components). As shown, the apparatus 2000 may communicate with another apparatus 2006 (such as a UE, a base station, or another wireless communication device) using the reception component 2002 and the transmission component 2004. As further shown, the apparatus 2000 may include one or more of a demapping component 2008, a de-interleaving component 2010, a concatenation component 2012, or a decoding component 2014, among other examples.

In some aspects, the apparatus 2000 may be configured to perform one or more operations described herein in connection with FIGS. 3-12. Additionally, or alternatively, the apparatus 2000 may be configured to perform one or more processes described herein, such as process 1800 of FIG. 18, or a combination thereof. In some aspects, the apparatus 2000 and/or one or more components shown in FIG. 20 may include one or more components of the base station described in connection with FIG. 2. Additionally, or alternatively, one or more components shown in FIG. 20 may be implemented within one or more components described in connection with FIG. 2. Additionally, or alternatively, one or more components of the set of components may be implemented at least in part as software stored in a memory. For example, a component (or a portion of a component) may be implemented as instructions or code stored in a non-transitory computer-readable medium and executable by a controller or a processor to perform the functions or operations of the component.

The reception component 2002 may receive communications, such as reference signals, control information, data communications, or a combination thereof, from the apparatus 2006. The reception component 2002 may provide received communications to one or more other components of the apparatus 2000. In some aspects, the reception component 2002 may perform signal processing on the received communications (such as filtering, amplification, demodulation, analog-to-digital conversion, demultiplexing, deinterleaving, de-mapping, equalization, interference cancellation, or decoding, among other examples), and may provide the processed signals to the one or more other components of the apparatus 2000. In some aspects, the reception component 2002 may include one or more antennas, a demodulator, a MIMO detector, a receive processor, a controller/processor, a memory, or a combination thereof, of the base station described in connection with FIG. 2.

The transmission component 2004 may transmit communications, such as reference signals, control information, data communications, or a combination thereof, to the apparatus 2006. In some aspects, one or more other components of the apparatus 2000 may generate communications and may provide the generated communications to the transmission component 2004 for transmission to the apparatus 2006. In some aspects, the transmission component 2004 may perform signal processing on the generated communications (such as filtering, amplification, modulation, digital-to-analog conversion, multiplexing, interleaving, mapping, or encoding, among other examples), and may transmit the processed signals to the apparatus 2006. In some aspects, the transmission component 2004 may include one or more antennas, a modulator, a transmit MIMO processor, a transmit processor, a controller/processor, a memory, or a combination thereof, of the base station described in connection with FIG. 2. In some aspects, the transmission component 2004 may be co-located with the reception component 2002 in a transceiver.

The transmission component 2004 may transmit an indication of one or more sets of time domain resources for a multi-slot transmission occasion that spans multiple slots. The reception component 2002 may receive, on the multi-slot transmission occasion, a communication including an interleaved encoded bit sequence of one or more codeblocks. The demapping component 2008 may demap the communication to obtain soft information for each of a plurality of transmitted bits. The de-interleaving component 2010 may de-interleave, to obtain de-interleaved soft information, the soft information on a per slot basis for each of the multiple slots, wherein start locations for bit selection for each of the multiple slots are determined independently from one another. The concatenation component 2012 may concatenate the de-interleaved soft information to obtain concatenated soft information. The decoding component 2014 may decode the concatenated soft information to infer one or more codeblocks of the communication.

The number and arrangement of components shown in FIG. 20 are provided as an example. In practice, there may be additional components, fewer components, different components, or differently arranged components than those shown in FIG. 20. Furthermore, two or more components shown in FIG. 20 may be implemented within a single component, or a single component shown in FIG. 20 may be implemented as multiple, distributed components. Additionally, or alternatively, a set of (one or more) components shown in FIG. 20 may perform one or more functions described as being performed by another set of components shown in FIG. 20.

The following provides an overview of some Aspects of the present disclosure:

Aspect 1: A method of wireless communication performed by a user equipment (UE), comprising: receiving an indication of one or more sets of time domain resources for a multi-slot transmission occasion that spans at least multiple slots; selecting, for one or more codeblocks of a communication on the multi-slot transmission occasion, coded bits of a plurality of coded bits on a per slot basis for each of the multiple slots, wherein start locations for bit selection for each of the multiple slots are independent of an actual number of bits selected for transmission in another slot; interleaving, for each of the multiple slots, the coded bits to form one or more interleaved encoded bit sequences of the one or more codeblocks; and transmitting the communication including the one or more interleaved encoded bit sequences.

Aspect 2: The method of Aspect 1, wherein selecting the coded bits on the per slot basis comprises: selecting a first subset of the plurality of coded bits for a first slot of the multi-slot transmission occasion; and selecting a second subset of the plurality of coded bits for a second slot of the multi-slot transmission occasion.

Aspect 3: The method of Aspect 1, wherein a start location of a given slot of the multiple slots is not adjacent to an end location of a prior slot of the multiple slots.

Aspect 4: The method of Aspect 1, further comprising: determining the start locations in accordance with an offset relative to a location of a circular buffer.

Aspect 5: The method of Aspect 4, wherein the multiple slots are associated with a redundancy version bundle corresponding to a redundancy version index indicating the location of the circular buffer.

Aspect 6: The method of Aspect 4, wherein the start locations are determined prior to selecting the coded bits.

Aspect 7: The method of Aspect 4, further comprising: determining the offset based at least in part on at least one of: a nominal number of resource elements available for the communication in a slot of the multiple slots, a modulation order of the communication, a number of layers of the communication, a number of the one or more codeblocks, or a scaling factor.

Aspect 8: The method of Aspect 7, wherein the scaling factor reduces a length of the offset.

Aspect 9: The method of Aspect 8, further comprising: receiving information indicating the scaling factor.

Aspect 10: The method of Aspect 7, wherein the nominal number of resource elements is based at least in part on at least one of a number of resource elements per physical resource block, a number of allocated physical resource blocks, a number of symbols allocated in a slot, an overhead associated with a demodulation reference signal resource, or an overhead associated with a factor other than a demodulation reference signal resource.

Aspect 11: The method of Aspect 4, wherein determining the start locations is based at least in part on information received from a base station.

Aspect 12: The method of Aspect 1, wherein the communication is a physical uplink shared channel (PUSCH) transmission that includes a single transport block, and wherein the multi-slot transmission occasion is a multi-slot PUSCH transmission occasion.

Aspect 13: The method of Aspect 1, further comprising: transmitting capability signaling indicating at least one of: whether multi-slot transmission occasions are supported, whether per slot rate matching is supported, whether per segment rate matching is supported, or whether interleaving can be dynamically turned on or off.

Aspect 14: A method of wireless communication performed by a base station, comprising: transmitting an indication of one or more sets of time domain resources for a multi-slot transmission occasion that spans at least multiple slots; receiving, on the multi-slot transmission occasion, a communication including an interleaved encoded bit sequence of one or more codeblocks; demapping the communication to obtain soft information for each of a plurality of transmitted bits; de-interleaving, to obtain de-interleaved soft information, the soft information on a per slot basis for each of the multiple slots; concatenating the de-interleaved soft information to obtain concatenated soft information, wherein start locations for concatenation for each of the multiple slots are independent of an actual number of bits selected for transmission in another slot; and decoding the concatenated soft information to infer the one or more codeblocks of the communication.

Aspect 15: The method of Aspect 14, wherein a start location of a given slot of the multiple slots is independent of a number of bits selected for a slot prior to the given slot.

Aspect 16: The method of Aspect 14, wherein a start location of a given slot of the multiple slots is not adjacent to an end location of a prior slot of the multiple slots.

Aspect 17: The method of Aspect 14, further comprising: determining the start locations in accordance with an offset relative to a location of a circular buffer.

Aspect 18: The method of Aspect 17, wherein the multiple slots are associated with a redundancy version bundle corresponding to a redundancy version index indicating the location of the circular buffer.

Aspect 19: The method of Aspect 17, further comprising: determining the offset based at least in part on at least one of: a nominal number of resource elements available for the communication in a slot of the multiple slots, a modulation order of the communication, a number of layers of the communication, a number of the one or more codeblocks, or a scaling factor.

Aspect 20: The method of Aspect 19, wherein the scaling factor reduces a length of the offset.

Aspect 21: The method of Aspect 20, further comprising: transmitting information indicating the scaling factor.

Aspect 22: The method of Aspect 19, wherein the nominal number of resource elements is based at least in part on at least one of a number of resource elements per physical resource block, a number of allocated physical resource blocks, a number of symbols allocated in a slot, an overhead associated with a demodulation reference signal resource, or an overhead associated with a factor other than a demodulation reference signal resource.

Aspect 23: The method of Aspect 14, wherein the communication is a physical uplink shared channel (PUSCH) transmission that includes a single transport block, and wherein the multi-slot transmission occasion is a multi-slot PUSCH transmission occasion.

Aspect 24: The method of any of Aspects 1-13, wherein a start location of a given slot of the multiple slots is independent of the end location of a prior slot of the multiple slots.

Aspect 25: The method of any of Aspects 1-13 or 24, wherein the start locations for bit selection for each of the multiple slots are determined irrespective of whether UCI is multiplexed in any slot of the multiple slots.

Aspect 26: The method of any of Aspects 1-13 or 24-25, wherein the coded bits are selected using a particular redundancy version (RV) across the multiple slots, wherein the multiple slots comprise an RV bundle.

Aspect 27: The method of Aspect 26, wherein the particular RV is indicated by an RV table that includes a sequence of RVs for the UE to use in different RV bundles.

Aspect 28: The method of any of Aspects 14-23, wherein a start location of a given slot of the multiple slots is independent of the end location of a prior slot of the multiple slots.

Aspect 29: The method of any of Aspects 14-23 or 28, wherein the start locations for bit selection for each of the multiple slots are determined irrespective of whether UCI is multiplexed in any slot of the multiple slots.

Aspect 30: The method of any of Aspects 14-23 or 28-29, wherein the coded bits are selected using a particular redundancy version (RV) across the multiple slots, wherein the multiple slots comprise an RV bundle.

Aspect 31: The method of Aspect 30, wherein the particular RV is indicated by an RV table that includes a sequence of RVs for the UE to use in different RV bundles.

Aspect 32: An apparatus for wireless communication at a device, comprising a processor; memory coupled with the processor; and instructions stored in the memory and executable by the processor to cause the apparatus to perform the method of one or more of Aspects 1-31.

Aspect 33: A device for wireless communication, comprising a memory and one or more processors coupled to the memory, the one or more processors configured to perform the method of one or more of Aspects 1-31.

Aspect 34: An apparatus for wireless communication, comprising at least one means for performing the method of one or more of Aspects 1-31.

Aspect 35: A non-transitory computer-readable medium storing code for wireless communication, the code comprising instructions executable by a processor to perform the method of one or more of Aspects 1-31.

Aspect 36: A non-transitory computer-readable medium storing a set of instructions for wireless communication, the set of instructions comprising one or more instructions that, when executed by one or more processors of a device, cause the device to perform the method of one or more of Aspects 1-31.

The foregoing disclosure provides illustration and description, but is not intended to be exhaustive or to limit the aspects to the precise forms disclosed. Modifications and variations may be made in light of the above disclosure or may be acquired from practice of the aspects.

As used herein, the term "component" is intended to be broadly construed as hardware, firmware, or a combination of hardware and software. As used herein, a processor is implemented in hardware, firmware, or a combination of hardware and software. It will be apparent that systems or methods described herein may be implemented in different forms of hardware, firmware, or a combination of hardware and software. The actual specialized control hardware or software code used to implement these systems or methods is not limiting of the aspects. Thus, the operation and behavior of the systems or methods were described herein without reference to specific software code—it being understood that software and hardware can be designed to implement the systems or methods based, at least in part, on the description herein.

As used herein, satisfying a threshold may, depending on the context, refer to a value being greater than the threshold, greater than or equal to the threshold, less than the threshold, less than or equal to the threshold, equal to the threshold, or not equal to the threshold, among other examples.

Even though particular combinations of features are recited in the claims or disclosed in the specification, these combinations are not intended to limit the disclosure of various aspects. In fact, many of these features may be combined in ways not specifically recited in the claims or disclosed in the specification. Although each dependent claim listed below may directly depend on only one claim, the disclosure of various aspects includes each dependent claim in combination with every other claim in the claim set. As used herein, a phrase referring to "at least one of" a list of items refers to any combination of those items, including single members. As an example, "at least one of: a, b, or c" is intended to cover a, b, c, a-b, a-c, b-c, and a-b-c, as well as any combination with multiples of the same element (for example, a-a, a-a-a, a-a-b, a-a-c, a-b-b, a-c-c, b-b, b-b-b, b-b-c, c-c, and c-c-c or any other ordering of a, b, and c).

No element, act, or instruction used herein should be construed as critical or essential unless explicitly described as such. Also, as used herein, the articles "a" and "an" are intended to include one or more items and may be used interchangeably with "one or more." Further, as used herein, the article "the" is intended to include one or more items referenced in connection with the article "the" and may be used interchangeably with "the one or more." Furthermore, as used herein, the terms "set" and "group" are intended to include one or more items (for example, related items, unrelated items, or a combination of related and unrelated items), and may be used interchangeably with "one or more." Where only one item is intended, the phrase "only one" or similar language is used. Also, as used herein, the terms "has," "have," "having," and similar terms are intended to be open-ended terms. Further, the phrase "based on" is intended to mean "based, at least in part, on" unless explicitly stated otherwise. Also, as used herein, the term "or" is intended to be inclusive when used in a series and may be used interchangeably with "and/or," unless explicitly stated otherwise (for example, if used in combination with "either" or "only one of").

What is claimed is:

1. An apparatus of a user equipment (UE) for wireless communication, comprising:
   one or more memories; and
   one or more processors, coupled to the one or more memories and configured to:
   receive an indication of one or more sets of time domain resources for a multi-slot transmission occasion that spans at least multiple slots;
   select, for one or more codeblocks of a communication on the multi-slot transmission occasion, coded bits of a plurality of coded bits on a per slot basis for each of the multiple slots, wherein start locations for bit selection for each of the multiple slots are independent of an actual number of bits selected for transmission in another slot;
   interleave, for each of the multiple slots, the coded bits to form one or more interleaved encoded bit sequences of the one or more codeblocks; and
   transmit the communication including the one or more interleaved encoded bit sequences.

2. The apparatus of claim 1, wherein a start location of a given slot of the multiple slots is independent of an end location of a prior slot of the multiple slots.

3. The apparatus of claim 1, wherein the start locations for bit selection for each of the multiple slots are determined irrespective of whether uplink control information is multiplexed in any slot of the multiple slots.

4. The apparatus of claim 1, wherein the coded bits are selected using a particular redundancy version (RV) across the multiple slots, wherein the multiple slots comprise an RV bundle.

5. The apparatus of claim 4, wherein the particular RV is indicated by an RV table that includes a sequence of RVs for the UE to use in different RV bundles.

6. The apparatus of claim 1, wherein the one or more processors, when selecting the coded bits on the per slot basis, are configured to:
select a first subset of the plurality of coded bits for a first slot of the multi-slot transmission occasion; and
select a second subset of the plurality of coded bits for a second slot of the multi-slot transmission occasion.

7. The apparatus of claim 1, wherein a start location of a given slot of the multiple slots is not adjacent to an end location of a prior slot of the multiple slots.

8. The apparatus of claim 1, wherein the one or more processors are further configured to:
determine the start locations in accordance with an offset relative to a location of a circular buffer.

9. The apparatus of claim 8, wherein the multiple slots are associated with a redundancy version bundle corresponding to a redundancy version index indicating the location of the circular buffer.

10. The apparatus of claim 8, wherein the start locations are determined prior to selecting the coded bits.

11. The apparatus of claim 1, wherein the one or more processors are further configured to:
transmit capability signaling indicating at least one of:
whether multi-slot transmission occasions are supported, whether per slot rate matching is supported, whether per segment rate matching is supported, or whether interleaving can be dynamically turned on or off.

12. An apparatus of a network node for wireless communication, comprising:
one or more memories; and
one or more processors coupled to the one or more memories, the one or more processors configured to:
transmit an indication of one or more sets of time domain resources for a multi-slot transmission occasion that spans multiple slots;
receive, on the multi-slot transmission occasion, a communication including an interleaved encoded bit sequence of one or more codeblocks;
demap the communication to obtain soft information for each of a plurality of transmitted bits;
de-interleave, to obtain de-interleaved soft information, the soft information on a per slot basis for each of the multiple slots;
concatenate the de-interleaved soft information to obtain concatenated soft information, wherein start locations for concatenation for each of the multiple slots are independent of an actual number of bits selected for transmission in another slot; and
decode the concatenated soft information to infer the one or more codeblocks of the communication.

13. The apparatus of claim 12, wherein a start location of a given slot of the multiple slots is independent of an end location of a prior slot of the multiple slots.

14. The apparatus of claim 12, wherein the start locations for bit selection for each of the multiple slots are determined irrespective of whether uplink control information is multiplexed in any slot of the multiple slots.

15. The apparatus of claim 12, wherein the coded bits are selected using a particular redundancy version (RV) across the multiple slots, wherein the multiple slots comprise an RV bundle.

16. The apparatus of claim 15, wherein the particular RV is indicated by an RV table that includes a sequence of RVs for a user equipment (UE) to use in different RV bundles.

17. A method of wireless communication performed by a user equipment (UE), comprising:
receiving an indication of one or more sets of time domain resources for a multi-slot transmission occasion that spans at least multiple slots;
selecting, for one or more codeblocks of a communication on the multi-slot transmission occasion, coded bits of a plurality of coded bits on a per slot basis for each of the multiple slots, wherein start locations for bit selection for each of the multiple slots are independent of an actual number of bits selected for transmission in another slot;
interleaving, for each of the multiple slots, the coded bits to form one or more interleaved encoded bit sequences of the one or more codeblocks; and
transmitting the communication including the one or more interleaved encoded bit sequences.

18. The method of claim 17, wherein a start location of a given slot of the multiple slots is independent of an end location of a prior slot of the multiple slots.

19. The method of claim 17, wherein the start locations for bit selection for each of the multiple slots are determined irrespective of whether uplink control information is multiplexed in any slot of the multiple slots.

20. The method of claim 17, wherein the coded bits are selected using a particular redundancy version (RV) across the multiple slots, wherein the multiple slots comprise an RV bundle.

21. The method of claim 20, wherein the particular RV is indicated by an RV table that includes a sequence of RVs for the UE to use in different RV bundles.

22. The method of claim 17, wherein selecting the coded bits on the per slot basis comprises:
selecting a first subset of the plurality of coded bits for a first slot of the multi-slot transmission occasion; and
selecting a second subset of the plurality of coded bits for a second slot of the multi-slot transmission occasion.

23. The method of claim 17, wherein a start location of a given slot of the multiple slots is not adjacent to an end location of a prior slot of the multiple slots.

24. The method of claim 17, further comprising:
determining the start locations in accordance with an offset relative to a location of a circular buffer.

25. The method of claim 17, wherein the communication is a physical uplink shared channel (PUSCH) transmission that includes a single transport block, and wherein the multi-slot transmission occasion is a multi-slot PUSCH transmission occasion.

26. A method of wireless communication performed by a network node, comprising:
transmitting an indication of one or more sets of time domain resources for a multi-slot transmission occasion that spans multiple slots;
receiving, on the multi-slot transmission occasion, a communication including an interleaved encoded bit sequence of one or more codeblocks;
demapping the communication to obtain soft information for each of a plurality of transmitted bits;
de-interleaving, to obtain de-interleaved soft information, the soft information on a per slot basis for each of the multiple slots;
concatenating the de-interleaved soft information to obtain concatenated soft information, wherein start locations for concatenation for each of the multiple slots are independent of an actual number of bits selected for transmission in another slot; and decoding the concatenated soft information to infer the one or more codeblocks of the communication.

27. The method of claim 26, wherein a start location of concatenation for a given slot of the multiple slots is independent of an end location of concatenation for a prior slot of the multiple slots.

28. The method of claim 26, wherein the start locations for concatenation for each of the multiple slots are determined irrespective of whether uplink control information is multiplexed in any slot of the multiple slots.

29. The method of claim 26, wherein the coded bits are associated with a particular redundancy version (RV) across the multiple slots, wherein the multiple slots are an RV bundle.

30. The method of claim 29, wherein the particular RV is indicated by an RV table that includes a sequence of RVs for different RV bundles.

* * * * *